(12) United States Patent
Belkerdid et al.

(10) Patent No.: US 7,804,377 B2
(45) Date of Patent: Sep. 28, 2010

(54) APPARATUS AND METHOD FOR PRODUCING AN SBPSK-TYPE MODULATED SIGNAL USING PIECEWISE LINEAR PHASE TRANSITION SHAPING

(75) Inventors: Madjid A. Belkerdid, Casselberry, FL (US); Robert G. Schumacher, Mason, OH (US); T J Mears, II, Orlando, FL (US)

(73) Assignees: Mnemonics, Inc., Melbourne, FL (US); Pole/Zero Acquisitions, Inc., West Chester, OH (US)

( * ) Notice: Subject to any disclaimer, the term of this patent is extended or adjusted under 35 U.S.C. 154(b) by 981 days.

(21) Appl. No.: 11/584,248

(22) Filed: Oct. 21, 2006

(65) Prior Publication Data

US 2008/0129405 A1    Jun. 5, 2008

(51) Int. Cl.
*H04L 27/20*    (2006.01)
(52) U.S. Cl. .................... 332/103; 332/144; 375/279; 375/308
(58) Field of Classification Search .......... 332/103, 332/144; 375/279, 308, 329
See application file for complete search history.

(56) References Cited

U.S. PATENT DOCUMENTS

| 4,281,412 A | 7/1981 | Wissel et al. |
| 4,614,910 A | 9/1986 | Ishigaki et al. |
| 4,704,582 A | 11/1987 | Dixon et al. |
| 6,072,841 A * | 6/2000 | Rahnema .................... 375/325 |
| 7,539,257 B2 * | 5/2009 | Norris et al. ................ 375/265 |

OTHER PUBLICATIONS

Dapper and Hill,"SBPSK: A Robust Bandwidth-Efficient Modulation for Hard-Limited Channels," IEEE MILCOM 1984, Oct. 1984.
Cofer, Franke, Johnson and Erman; "Shaped PSK in a Digital Modem with Direct Digital Synthesis," IEEE MILCOM '90, Sep. 1990, pp. 86-92.
Franke, "A UHF Adjacent Channel SATCOM Interference," IEEE MILCOM '93, Oct. 1993.
Belkerdid, Mears, Weeter, "UHF SATCOM Adjacent Channel Emissions and Modem Implementation Loss: Predictions/Measurements for the Linear Phase SBPSK Modulation Waveform Family," IEEE MILCOM '05, Oct. 2005.
MIL-STD-188-181A, "Interoperability Standard for Dedicated 5 and 25 kHz UHF Satellite Communications Channels," Sep. 18, 1992 (Relevant excerpts only).
MIL-STD-188-182, "Interoperability Standard for Dedicated 5 and 25 kHz UHF DAMA Terminal Waveform," Sep. 18, 1992 (Relevant excerpts only).
MIL-STD-188-183, "Interoperability Standard 25 kHz UHF TDAMA/DAMA Terminal Waveform," Sep. 18, 1992 (Relevant excerpts only).

* cited by examiner

*Primary Examiner*—Robert Pascal
*Assistant Examiner*—Levi Gannon
(74) *Attorney, Agent, or Firm*—John L. DeAngelis; Beusse Wolter Sanks Mora & Maire, P.A.

(57) ABSTRACT

An apparatus and method for generating piecewise linear phase transitions during a phase transition interval of a first signal to control controlling the phase/frequency of a second signal. The initiation point, duration and shaping parameters of the piecewise linear phase transitions are selected to control adjacent channel emissions in the second signal.

25 Claims, 41 Drawing Sheets

| SF | Delta f (Hz) | |
|---|---|---|
| | 2400 bps | 9600 bps |
| 50 % | 2400 | 9600 |
| 60 % | 2000 | 8000 |
| 62.50 % | 1920 | 7680 |
| 75 % | 1600 | 6400 |
| 80 % | 1500 | 6000 |
| 100 % | 1200 | 4800 |

FIGURE 7

| 50 % SBPSK @2400 bps | Center of adjacent channels frequency offsets (kHz) | | | | | |
|---|---|---|---|---|---|---|
| | 5 | 10 | 15 | 20 | 25 | 30 |
| Simulation | -15.7 | -35.7 | -43.5 | -48.7 | -52.6 | -55.6 |
| Measured | -15.7 | -34.4 | -41.2 | -46.4 | -51.0 | -54.6 |
| Reported by E. Franke* | -15.5 | -35.7 | -43.8 | -48.8 | -52.4 | -55.9 |
| Specs (181A-NB) | -14.0 | -34.0 | -38.0 | -40.0 | -40.0 | -40.0 |

*E. Franke "UHF Adjacent Channel SATCOM Interference", IEEE MILCOM '93, Oct 1993

FIGURE 11

| 50 % SBPSK @4800 bps | Center of adjacent channels frequency offsets (kHz) | | | | | |
|---|---|---|---|---|---|---|
| | 25 | 50 | 75 | 100 | 125 | 150 |
| Simulation | -34.0 | -47.7 | -55.1 | -59.8 | -62.2 | -64.8 |
| Measured | -33.1 | -47.1 | -54.5 | -59.3 | -61.4 | -64.3 |
| Specs (181A-NB) | -17.0 | -37.0 | -40.0 | -40.0 | -40.0 | -40.0 |

FIGURE 12

| 50 % SBPSK @9600 bps | Center of adjacent channels frequency offsets (kHz) | | | | | |
|---|---|---|---|---|---|---|
| | 25 | 50 | 75 | 100 | 125 | 150 |
| Simulation | -17.9 | -38.6 | -47.8 | -51.9 | -54.7 | -59.0 |
| Measured | -17.7 | -38.7 | -47.7 | -52.5 | -54.8 | -59.6 |
| Reported by E. Franke* | -17.9 | -38.5 | -48.2 | -52.3 | -51.6 | -58.1 |
| Specs (181A-NB) | -17.0 | -37.0 | -40.0 | -40.0 | -40.0 | -40.0 |

FIGURE 13

*E. Franke "UHF Adjacent Channel SATCOM Interference", IEEE MILCOM '93, Oct 1993

| SF | 2400 bps | | 9600 bps | |
|---|---|---|---|---|
| | $\Delta f_1$ (Hz) | $\Delta f_2$ (Hz) | $\Delta f_1$ (Hz) | $\Delta f_2$ (Hz) |
| 50 % | 2040 | 2760 | 8160 | 11040 |
| 60 % | 1700 | 2300 | 6800 | 9200 |
| 62.5 % | 1632 | 2208 | 6528 | 8832 |
| 75 % | 1360 | 1840 | 5440 | 7360 |
| 80 % | 1275 | 1725 | 5100 | 5900 |
| 100 % | 1029 | 1380 | 4080 | 5520 |

FIGURE 20

| SF | Shaping | Center of adjacent channels frequency offsets (kHz) | | | | | |
|---|---|---|---|---|---|---|---|
| | | 5 | 10 | 15 | 20 | 25 | 30 |
| 50 | SBPSK | -15.7 | -35.7 | -43.5 | -48.7 | -52.6 | -55.7 |
| | PWL SBPSK | -15.3 | -41.3 | -45.1 | -46.3 | -52.0 | -57.4 |
| 55 | SBPSK | -16.3 | -35.4 | -43.8 | -49.7 | -54.2 | -57.6 |
| | PWL-SBPSK | -15.7 | -43.4 | -44.3 | -48.3 | -54.1 | -56.1 |
| 60 | SBPSK | -16.9 | -35.9 | -45.7 | -51.5 | -54.2 | -56.8 |
| | PWL-SBPSK | -16.3 | -42.7 | -44.2 | -50.2 | -54.8 | -54.5 |
| 65 | SBPSK | -17.6 | -37.4 | -47.2 | -50.6 | -55.6 | -59.1 |
| | PWL-SBPSK | -16.7 | -42.8 | -44.3 | -50.5 | -55.0 | -55.0 |
| 70 | SBPSK | -18.4 | -39.5 | -46.1 | -52.5 | -55.5 | -58.7 |
| | PWL-SBPSK | -17.5 | -42.5 | -44.2 | -51.9 | -53.4 | -55.5 |
| 75 | SBPSK | -19.2 | -40.8 | -46.9 | -52.7 | -56.8 | -59.0 |
| | PWL-SBPSK | -18.1 | -41.3 | -44.9 | -52.0 | -52.7 | -55.5 |
| 80 | SBPSK | -20.2 | -40.5 | -48.7 | -52.6 | -56.6 | -60.5 |
| | PWL-SBPSK | -19.0 | -40.7 | -47.4 | 53.0 | -53.4 | -57.3 |
| 85 | SBPSK | -21.2 | -40.0 | -48.7 | -54.2 | -57.5 | -59.8 |
| | PWL-SBPSK | -19.8 | -40.3 | -48.6 | -52.3 | -54.3 | -57.6 |
| 90 | SBPSK | -22.3 | -40.2 | -48.5 | -53.7 | -57.6 | -60.7 |
| | PWL-SBPSK | -20.7 | -40.5 | -48.2 | -51.1 | -54.9 | -56.2 |
| 95 | SBPSK | -23.6 | -40.9 | -49.1 | -54.2 | -57.8 | -60.5 |
| | PWL-SBPSK | -21.6 | -40.8 | -48.4 | -51.4 | -54.7 | -56.0 |
| 100 | SBPSK | -24.9 | -42.1 | -50.2 | -55.3 | -58.9 | -61.7 |
| | PWL-SBPSK | -22.8 | -41.2 | -49.3 | -51.4 | -55.2 | -56.0 |

FIGURE 27

| SF | Shaping | Center of adjacent channels frequency offsets (kHz) | | | | | | |
|---|---|---|---|---|---|---|---|---|
| | | 25 | 50 | 75 | 100 | 125 | 150 |
| 50 | SBPSK | -34.0 | -47.7 | -55.1 | -59.8 | -62.2 | -64.8 |
| | PWL-SBPSK | -32.7 | -46.3 | -52.6 | -56.7 | -58.3 | -60.0 |
| 55 | SBPSK | -34.4 | -49.4 | -56.1 | -60.2 | -63.0 | -64.9 |
| | PWL-SBPSK | -36.0 | -49.0 | -53.6 | -57.4 | -59.8 | -61.1 |
| 60 | SBPSK | -34.1 | -49.3 | -56.3 | -60.8 | -63.9 | -66.0 |
| | PWL-SBPSK | -38.4 | -49.1 | -53.7 | -57.2 | -59.5 | -61.2 |
| 65 | SBPSK | -34.0 | -50.5 | -57.4 | -61.2 | -64.5 | -66.1 |
| | PWL-SBPSK | -39.5 | -49.9 | -55.3 | -57.9 | -60.2 | -61.8 |
| 70 | SBPSK | -34.5 | -51.1 | -58.0 | -61.8 | -64.9 | -66.8 |
| | PWL-SBPSK | -39.2 | -50.2 | -54.7 | -57.5 | -59.6 | -61.1 |
| 75 | SBPSK | -35.5 | -51.0 | -57.3 | -61.2 | -63.6 | -65.3 |
| | PWL-SBPSK | -39.2 | -49.9 | -54.5 | -57.3 | -59.3 | -60.8 |
| 80 | SBPSK | -36.9 | -52.1 | -58.4 | -62.1 | -64.5 | -66.2 |
| | PWL-SBPSK | -39.5 | -50.7 | -55.7 | -58.7 | -60.9 | -62.5 |
| 85 | SBPSK | -38.3 | -52.2 | -59.0 | -62.9 | -65.3 | -67.2 |
| | PWL-SBPSK | -39.4 | -50.4 | -55.5 | -58.4 | -60.4 | -62.1 |
| 90 | SBPSK | -39.0 | -53.0 | -59.2 | -63.3 | -65.9 | -67.5 |
| | PWL-SBPSK | -39.1 | -50.4 | -54.9 | -58.0 | -59.9 | -61.4 |
| 95 | SBPSK | -38.9 | -53.4 | -59.9 | -63.6 | -66.1 | -67.7 |
| | PWL-SBPSK | -38.8 | -49.9 | -54.9 | -57.6 | -59.4 | -60.9 |
| 100 | SBPSK | -38.7 | -53.5 | -59.9 | -63.6 | -65.9 | -67.5 |
| | PWL-SBPSK | -38.7 | -50.2 | -55.1 | -57.7 | -59.6 | -61.1 |

FIGURE 28

| SF | Shaping | Center of adjacent channels frequency offsets (kHz) | | | | | |
|---|---|---|---|---|---|---|---|
| | | 25 | 50 | 75 | 100 | 125 | 150 |
| 50 | SBPSK | -17.9 | -38.6 | -47.8 | -51.9 | -54.7 | -59.0 |
| | PWL-SBPSK | -17.1 | -43.5 | -45.0 | -50.5 | -54.1 | -54.5 |
| 55 | SBPSK | -18.9 | -41.4 | -47.4 | -52.1 | -56.8 | -58.7 |
| | PWL-SBPSK | -17.8 | -43.8 | -45.1 | -51.8 | -54.3 | -55.4 |
| 60 | SBPSK | -20.0 | -42.1 | -47.7 | -53.6 | -57.1 | -59.4 |
| | PWL-SBPSK | -18.8 | -42.5 | -46.0 | -53.3 | -53.8 | -56.6 |
| 65 | SBPSK | -21.2 | -41.2 | -50.0 | -53.5 | -57.2 | -60.9 |
| | PWL-SBPSK | -19.8 | -41.4 | -48.1 | -52.4 | -53.1 | -56.2 |
| 70 | SBPSK | -22.6 | -41.5 | -49.3 | -54.8 | -58.5 | -61.2 |
| | PWL-SBPSK | -20.7 | -41.7 | -49.0 | -51.9 | -54.6 | -56.6 |
| 75 | SBPSK | -24.1 | -42.9 | -49.9 | -54.6 | -58.4 | -61.3 |
| | PWL-SBPSK | -21.9 | -42.1 | -48.8 | -51.4 | -54.6 | -55.7 |
| 80 | SBPSK | -25.7 | -44.3 | -51.2 | -55.8 | -59.4 | -62.0 |
| | PWL-SBPSK | -23.1 | -42.1 | -49.4 | -51.2 | -54.4 | -55.3 |
| 85 | SBPSK | -27.4 | -44.8 | -51.4 | -55.7 | -59.3 | -62.6 |
| | PWL-SBPSK | -24.5 | -42.0 | -50.1 | -51.5 | -54.3 | -56.0 |
| 90 | SBPSK | -29.0 | -44.4 | -51.2 | -56.7 | -60.0 | -62.4 |
| | PWL-SBPSK | -25.8 | -41.8 | -49.1 | -51.9 | -53.8 | -55.5 |
| 95 | SBPSK | -30.4 | -44.3 | -52.7 | -56.5 | -60.4 | -62.6 |
| | PWL-SBPSK | -27.5 | -42.8 | -50.1 | -53.5 | -55.3 | -57.2 |
| 100 | SBPSK | -31.1 | -45.4 | -52.6 | -57.3 | -60.3 | -63.5 |
| | PWL-SBPSK | -29.0 | -43.7 | -49.2 | -52.7 | -54.3 | -56.0 |

FIGURE 29

| | | Center of adjacent channels frequency offsets (kHz) | | | | | |
|---|---|---|---|---|---|---|---|
| | | 5 | 10 | 15 | 20 | 25 | 30 |
| 50 % SBPSK | Simulation | -15.7 | -35.7 | -43.5 | -48.7 | -52.6 | -55.6 |
| | Measured | -15.7 | -34.4 | -41.2 | -46.4 | -51.0 | -54.6 |
| | *E. Franke | -15.5 | -35.7 | -43.8 | -48.8 | -52.4 | -55.9 |
| MIL STD 188-181A | | -14 | -34 | -38 | -40 | -40 | -40 |
| 62.5% PWL SBPSK Results | Simulation | -17.1 | -40.3 | -45.5 | -50.5 | -54.1 | -55.4 |
| | Measured | -15.9 | -39.1 | -42.0 | -46.1 | -52.1 | -58.0 |

*E. Franke "UHF Adjacent Channel SATCOM Interference", *IEEE MILCOM '93*, Oct 1993

FIGURE 36

| | | Center of adjacent channels frequency offsets (kHz) | | | | | |
|---|---|---|---|---|---|---|---|
| | | 25 | 50 | 75 | 100 | 125 | 150 |
| 50 % SBPSK | Simulation | -34.0 | -47.7 | -55.1 | -59.8 | -62.2 | -64.8 |
| | Measured | -33.1 | -47.1 | -54.5 | -59.3 | -61.4 | -64.3 |
| MIL STD 188-181A | | -17.0 | -37.0 | -40.0 | -40.0 | -40.0 | -40.0 |
| 62.5% PWL SBPSK Results | Measured | -37.5 | -48.3 | -56.6 | -61.7 | -63.9 | -67.3 |

FIGURE 37

|  |  | Center of adjacent channels frequency offsets (kHz) | | | | | |
|---|---|---|---|---|---|---|---|
|  |  | 25 | 50 | 75 | 100 | 125 | 150 |
| 50 % SBPSK | Simulation | -17.9 | -38.6 | -47.8 | -51.9 | -54.7 | -59.0 |
|  | Measured | -17.7 | -38.7 | -47.7 | -52.5 | -54.8 | -59.6 |
|  | *E. Franke | -17.9 | -38.5 | -48.2 | -52.3 | -51.6 | -58.1 |
| MIL STD 188-181A |  | -17.0 | -37.0 | -40.0 | -40.0 | -40.0 | -40.0 |
| 62.5% PWL SBPSK Results | Simulation | -19.1 | -41.6 | -46.9 | -51.3 | -53.0 | -55.1 |
|  | Measured | -18.1 | -45.2 | -47.8 | -53.5 | -60.7 | -60.4 |

FIGURE 38

*E. Franke "UHF Adjacent Channel SATCOM Interference", <u>IEEE MILCOM '93</u>, Oct 1993

APPARATUS AND METHOD FOR PRODUCING AN SBPSK-TYPE MODULATED SIGNAL USING PIECEWISE LINEAR PHASE TRANSITION SHAPING

FIELD OF THE INVENTION

The present invention relates generally to modulating a continuous time signal and more particularly to modulating the signal by generating piecewise linear phase transitions in the signal responsive to data transitions in a modulating data signal.

BACKGROUND OF THE INVENTION

The power in a transmitted signal is segregated between a carrier frequency (channel) and adjacent frequency bands (channels). All transmitted signal waveforms spill some power from the main lobe (the carrier frequency) into the adjacent channels. Filtering at the receiver minimizes the effects of the adjacent channel power during the demodulation and detection process. Although the adjacent channel power may be relatively small compared with the carrier frequency power, the adjacent channel power is a source of interference and signal quality degradation for other users operating in the same frequency band.

The frequencies adjacent the carrier can be segregated into 5 kHz channels (referred to as narrowband channels) and 25 kHz channels (referred to as wideband channels) for analysis of the adjacent channel power. The power emitted in the adjacent channels is computed by integrating the transmitted power spectral density (PSD) over the desired 5 kHz bandwidth or over a desired 25 kHz bandwidth. The center of the each channel is therefore offset by 5 kHz or by 25 kHz from the adjacent channel for the narrowband and wideband cases, respectively.

MIL-STD-188-181A, MIL-STD-188-182 and MIL-STD-188-183 define allowable limits of adjacent channel emissions (ACE) for all transmissions on US-owned ultra-high frequency (UHF) satellite communications (SATCOM) channels. The ACE requirements, which are specified for both 5 kHz narrowband channels and 25 kHz wideband channels, limit the amount of energy that can be spilled into adjacent (offset) channels above and below the main (carrier) transmitting channel (frequency).

The two primary modulation techniques recommended by the aforementioned MIL standards include a linear 50% shaped binary phase shift keyed (SBPSK, a form of BPSK) modulation and 50% shaped offset quadrature shift keyed (SOQPSK) modulation. These modulation techniques attempt to limit the sidelobe power by producing a modulating signal that has a continuous phase transition. The SOQPSK technique offers outstanding side lobe suppression that satisfies the MIL standard ACE requirements.

The 50% SBPSK modulating waveform recommended in MIL-STD-188-181A, however, may not provide sufficient ACE margin in the first two 5 kHz offset channels at a maximum data rate of 2400 bps, nor in the first two 25 kHz offset channels at a data rate of 9600 bps. With little margin over the requirements when 50% BPSK is employed, hardware limitations may further degrade ACE performance and cause out-of-spec operation.

A BPSK modulated carrier is characterized by inherently high side lobes (the first sidelobe is at only −13 dBc), as illustrated by the power spectral density of a BPSK modulated signal shown in FIG. 1. The energy spilled over into the first six 5-kHz channels, each marked by one of six horizontal bars in FIG. 1, far exceed the allowed emissions specified by the MIL-STD 188-181A.

SBPSK modulation reduces energy spillage in the adjacent channels by virtue of its low-level side lobes. When employed to modulate a carrier signal, SBPSK modulation linearly changes the carrier phase trajectory by 180 degrees over a time interval shorter than a bit period. In an embodiment where the time interval is zero, the resulting waveform is BPSK, i.e., an instantaneous 180 degree phase transition (a 180 degree phase transition in zero time). If the transition time is half a bit period, the modulation is referred to as 50% SBPSK. Thus a ratio of the phase transition time to the bit period represents the shape factor for the phase transition. Shape factors can range from zero to 100% of the bit period.

For BPSK or SBPSK phase transitions occur only when the data bits transitions from a one to a zero and from a zero to a one. The phase transitions from zero to 180 degrees ($\pi$ radians) must alternate direction, i.e. if the previous phase transition was from zero to 180 degrees, the next phase transition, when it occurs, must be from zero to −180 degrees. This phase derotation must be maintained to avoid generating a frequency offset in the resulting signal. This rotation is depicted in FIG. 2 where sequence numbers 1 through 4 referring to a half circle denote the direction of phase transition between zero, $\pi$ and $-\pi$ for a data sequence of 1010.

The phase transitions for various SBPSK shape factors are depicted in FIG. 3 for a data stream with bit intervals of Tb and a bit rate of 1/Tb bits per second. A curve 20 represents the phase transitions for BPSK, a curve 22 represents the phase transitions for a 50% SBPSK (i.e., BPSK with a shaping factor of 50%, where the shaping factor designates a portion of the bit period during which the phase is changing) signal, a curve 24 represents the phase transitions for a 75% SBPSK signal and a curve 26 represents the phase transitions for a 100% SBPSK signal. The data stream is delayed by at least one bit period so that it can be determined whether a transition occurs at the next data bit and the transition shaped as desired if a transition occurs.

SBPSK modulation with any shaping factor is characterized by a single linear phase function, as can be seen from the phase transition straight lines in FIG. 3. Note that the phase transitions for the different shaping factors start at different times of the bit interval. For example, common BPSK presents no shaping and the bit transition is therefore instantaneous. A 50% SBPSK phase transition spans one-half of a bit interval, including a portion of both a first bit interval and a second bit interval. A first portion of the transition interval occurs during a last quarter of the first bit interval and a second portion of the transition interval occurs during a first quarter of the second bit interval. Thus the total phase transition time is one-half a bit interval. If a third bit is opposite polarity to the second bit, the 50% SBPSK phase transition spans a last quarter of the second bit interval and a first quarter of the third bit interval. Similarly, a 75% SBPSK phase transition spans ⅜ of the first bit interval and ⅜ of the second bit interval for a total transition time of ¾ of a bit interval. 100% SBPSK spans ½ of the first bit interval and ½ of the second bit interval for a total transition time of one bit interval.

The derivative of the linear phase functions of FIG. 3 with respect to time is a constant. Thus the modulated signal comprises a constant frequency during the phase transition portion of the bit interval.

Various waveforms corresponding to a prior art 50% SBPSK signal are shown in FIG. 4. FIG. 4 depicts a modulating data signal, a corresponding carrier phase trajectory, in-phase (I) and quadrature-phase (Q) signals and a modulated carrier, including phase transitions illustrated therein.

FIG. 5 illustrates a power spectral density plot 40 of a 50% SBPSK signal super-imposed on a power spectral density plot 42 of a BPSK signal. It is noted that the spectral confinement (reduced ACE) for SBPSK is visibly improved when compared with BPSK, especially for the second and subsequent signal side lobes.

Phase transitions and frequency deviations for a 50% SBPSK waveform modulated by a 10101010 bit sequence are shown in FIG. 6. As can be seen, the frequency deviation waveform resembles continuous-phase 3-ary FSK type modulation, with frequency deviations of 0, $+\Delta f$ and $-\Delta f$.

A numerically controlled oscillator modulator (NCOM) can be used to digitally generate an SBPSK signal. Since the derivative of phase is frequency, linear phase transitions of SBPSK are implemented as step changes in frequency during the phase transition periods. The transitions can be linear phase transitions with positive slope or negative slope or the transitions can be constant-valued phase transitions. The carrier frequency is selected from among $f_c+\Delta f, f_c-\Delta f$ or $f_c$.

According to SBPSK modulation implemented with the NCOM the instantaneous frequency is read from a three element look-up table responsive to a bit rate clock interrupt and the value of the next bit (or symbol). Exemplary delta frequency values are set forth in FIG. 7 for 2400 bps and 9600 bps data rates and for 50%, 60%, 62.5%, 75%, 80%, and 100% shaping factors (SF).

FIG. 8 depicts the peak frequency deviation of 50%, 62.5%, and 75% SBPSK modulated carriers respectively for a data rate of 2400 bps as computed from the slope of the linear phase segments, as illustrated in FIG. 6, for example.

The peak frequency deviation of the SBPSK modulated carrier is the derivative of the carrier instantaneous phase with respect to time as described below:

$$\Delta f = \frac{\Delta \omega}{2\pi} = \frac{1}{2\pi}\frac{d\phi(t)}{dt} \text{ Hz}$$

Since the instantaneous phase of the SBPSK modulated carrier is linear, the derivative is then equivalent to its slope. The frequency offset for SBPSK is then modeled by:

$$\Delta f = \frac{\pi}{2\pi \times SF \times T_b} = \frac{\pi R_b}{2\pi \times SF} = \frac{R_b}{2 \times SF}$$

where $R_b=1/T_b$ is the bit rate and SF is the shape factor.

FIG. 9 depicts power spectral density simulation results for a 50% SBPSK shaping factor (a curve 60) and a 75% SBPSK shaping factor (a curve 62) for the 5 kHz narrow band channel at the 2400 bps data rate. Note the spectral confinement for a shape factor of 75% is better than the 50% shape factor especially at frequencies closer to the carrier frequency.

FIG. 10 depicts power spectral density simulation results for 50% (a curve 66) and 75% (a curve 67) SBPSK shaping factors for the 25 kHz wide band channel at a 9600 bps data rate. The spectral confinement for a 75% SBPSK shape factor is better than the 50% SBPSK shape factor especially at frequencies adjacent the carrier frequency. The power spectral density simulation for a 4800 bps signal reveals similar results.

FIG. 11 summarizes simulated and measured ACE performance for a 50% SBPSK signal in the 5 kHz channel at 2400 bps and the ACE requirements according to the MIL-STD-188-181A. It is clear that the ACE margin is narrow for this case especially in the 5 and 10 kHz adjacent channels. Therefore an improvement in ACE margin is desired.

FIG. 12 summarizes simulated and measured ACE performance for a 50% SBPSK signal in the 25 kHz channel at 4800 bps. In this case the ACE margin complies with the MIL-STD-188-181A requirements.

FIG. 13 summarizes simulated and measure ACE performance for a 50% SBPSK signal in the 25 kHz channel at 9600 bps. As shown, the ACE margin is narrow, especially in the 25 and 50 kHz adjacent channels. An improvement in the ACE margin is desired.

As can be seen from the above discussion and illustrative figures, The ACE performance improves with higher linear SBPSK shaping factors. However, it is known that these SBPSK shaping factors tend to reduce bit error rate (BER) performance. It is known that the 75% SBPSK shape factor yields a minimum of 5 dB of ACE margin over 50% SBPSK, at the expense of 1 dB over the 50% SBPSK implementation loss. Implementation loss refers to the affect of the shaping factor on bit error rate (BER) performance. For a fixed BER, the difference in the ratio of bit energy to noise energy (Eb/No) for a 75% shaping factor and a 50% shaping factor is the implementation loss. For example, to attain a BER of 10E-5, a 75% shaping factor signal requires an Eb/No value of 10 dB, while a 50% shaping factor signal requires an Eb/No value of 9 dB. Thus the implementation loss for the 75% shaping factor signal is 1 dB. FIG. 14 depicts measured values illustrating the effect of the shaping factor on the BER performance. A curve 100 depicts the BER performance of a theoretical BPSK transmitted signal. A curve 104 illustrates the BER performance for a BPSK signal demodulated by a coherent matched filter BPSK demodulator. BER curves generated by the same BPSK coherent demodulator for linear 50% SBPSK (curve 108), linear 62.5% SBPSK (curve 112) and linear 75% SBPSK (curve 116) transmitted signals are also depicted in FIG. 16. It can be seen that linear 50% SBPSK has about 1 dB implementation loss at a BER of about 10E-5. Linear 62.5% SBPSK adds an additional 0.5 dB loss, while linear 75% adds another dB of implementation loss over linear 50% SBPSK at a BER of about 10E-5.

BRIEF SUMMARY OF THE INVENTION

In one embodiment the present invention comprises a method for shaping phase transitions of a modulated signal during a phase transition interval of a modulating signal. The method comprises identifying two or more continuous curve segments each representing a different phase trajectory to shape the phase transition, at least two of the two or more curve segments having different phase shaping parameters and transitioning the phase of the modulated signal from a first phase to a second phase during the phase transition interval according to the phase shaping parameters.

In another embodiment the present invention comprises an apparatus for producing a modulated carrier signal responsive to a modulating signal. The apparatus comprises a phase trajectory generator responsive to the modulating signal for producing a modified modulating signal comprising two or more continuous curve segments each presenting a different phase shaping parameter during a phase transition interval and a modulator responsive to the modified modulating signal for producing the modulated signal having a characteristic responsive to the phase shaping parameters of the modulating signal.

BRIEF DESCRIPTION OF THE FIGURES

The present invention can be more easily understood and the advantages and uses thereof more readily apparent when the following detailed description of the present invention is read in conjunction with the figures summarized below. In accordance with common practice the various described features are not drawn to scale, but are drawn to emphasize specific features relevant to the invention. Like reference characters denote like elements throughout the figures and text.

FIG. 7 is a diagram of a delta frequencies for different shaping factors for 2400 and 9600 bps data rate SBPSK signal.

FIGS. 11-13 are tables illustrating adjacent channel energy for 50% shaping factor SBPSK signals at various data rates.

FIG. 20 is a diagram of frequency deviations $\Delta f_1$ and $\Delta f_2$ for different shaping factors for PWL-SBPSK at 2400 and 9600 bps.

FIGS. 27-29 depict ACE simulation results for 2400 bps SBPSK and PWL SBPSK, for 4800 bps SBPSK and PWL SBPSK and for 9600 bps SBPSK and PWL SBPSK, respectively.

FIGS. 36-38 are diagrams illustrating the adjacent channel emissions for a 62.5% PWL SBPSK signal at respective data rates of 2400 bps, 4800 bps and 9600 bps.

DETAILED DESCRIPTION OF THE INVENTION

Figure 1:
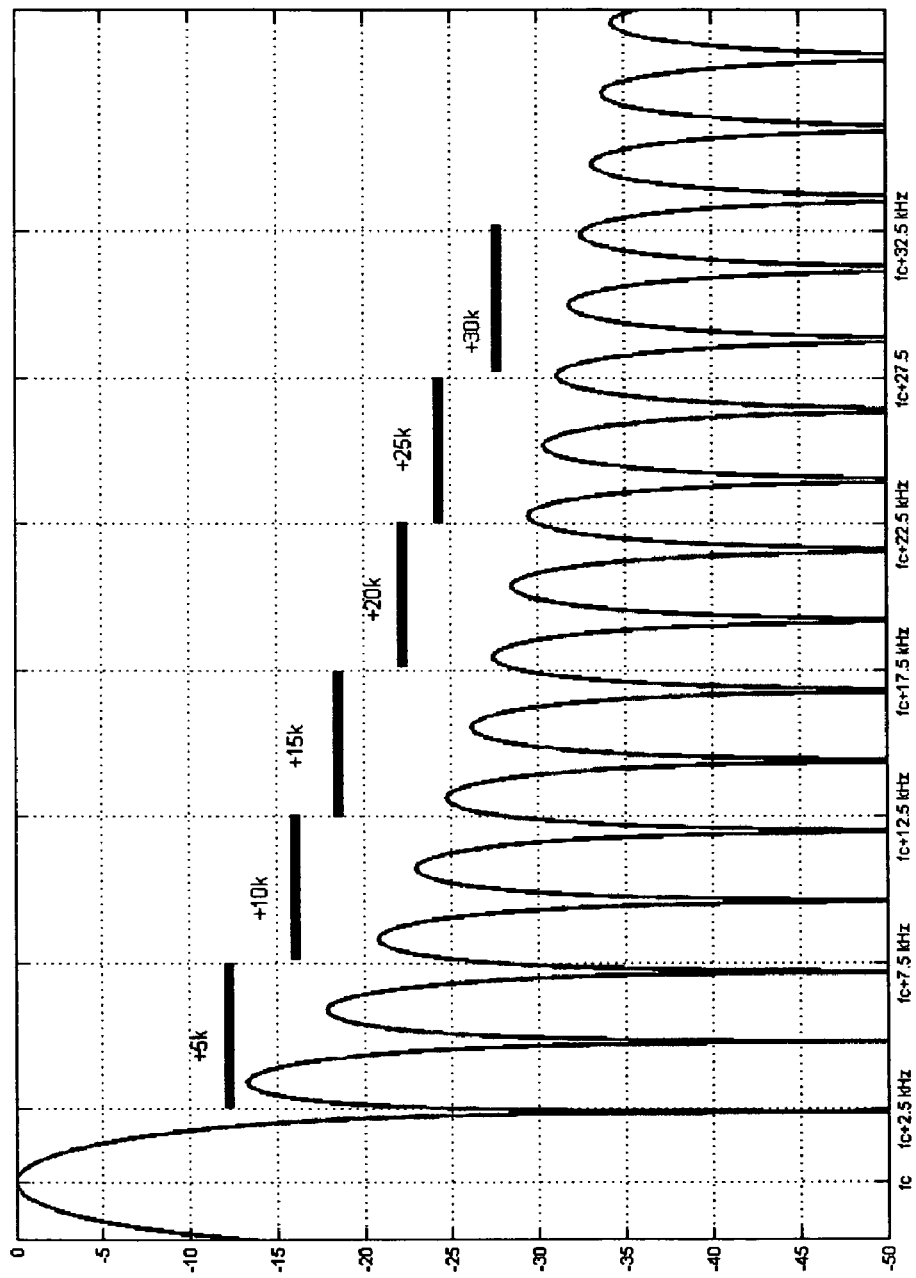
FIG. 1 is a diagram of the power spectral density of a BPSK signal.
Figure 2:
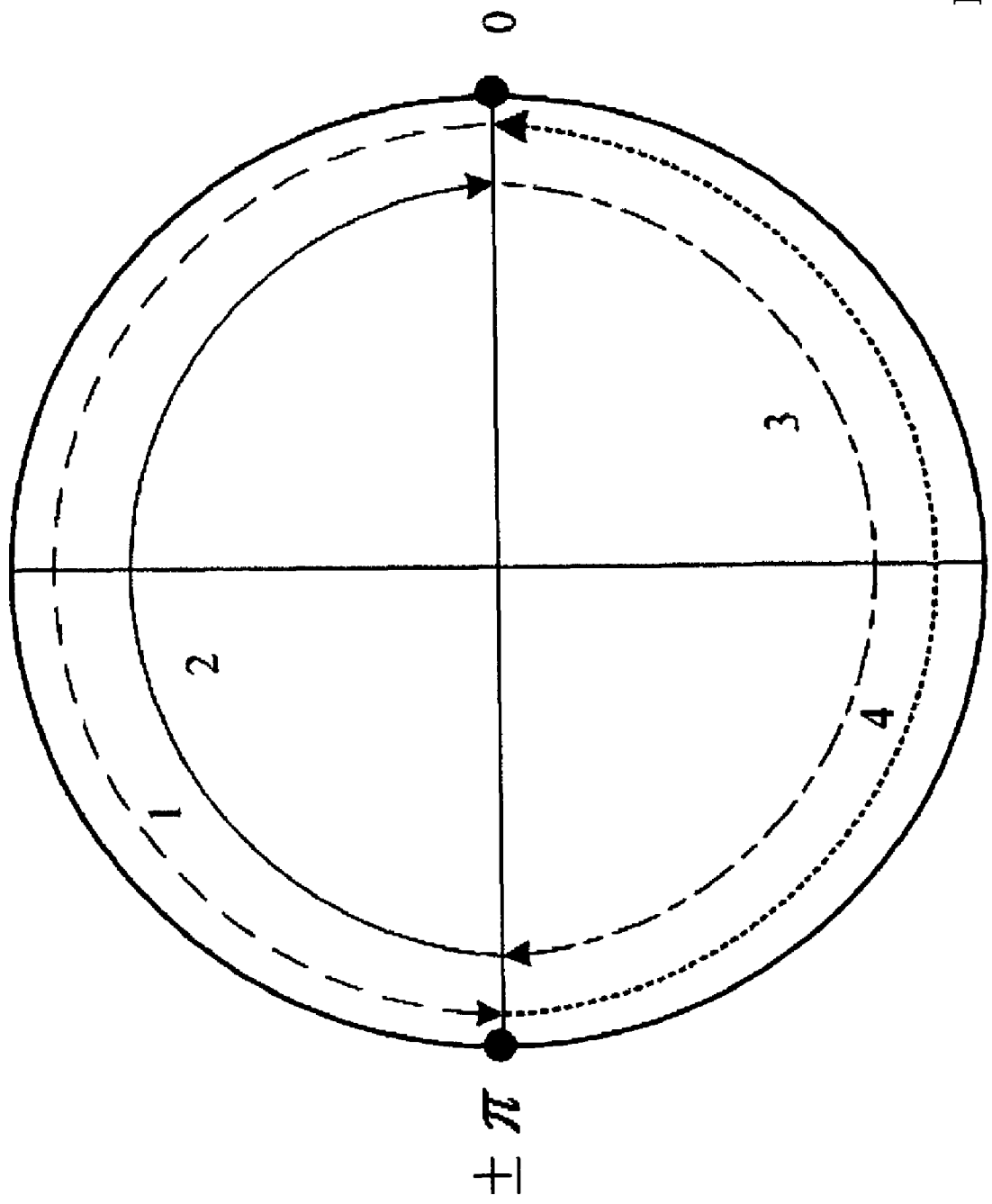
FIG. 2 is a diagram of the constellation diagram with phase rotation of an SBPSK signal.
Figure 3:
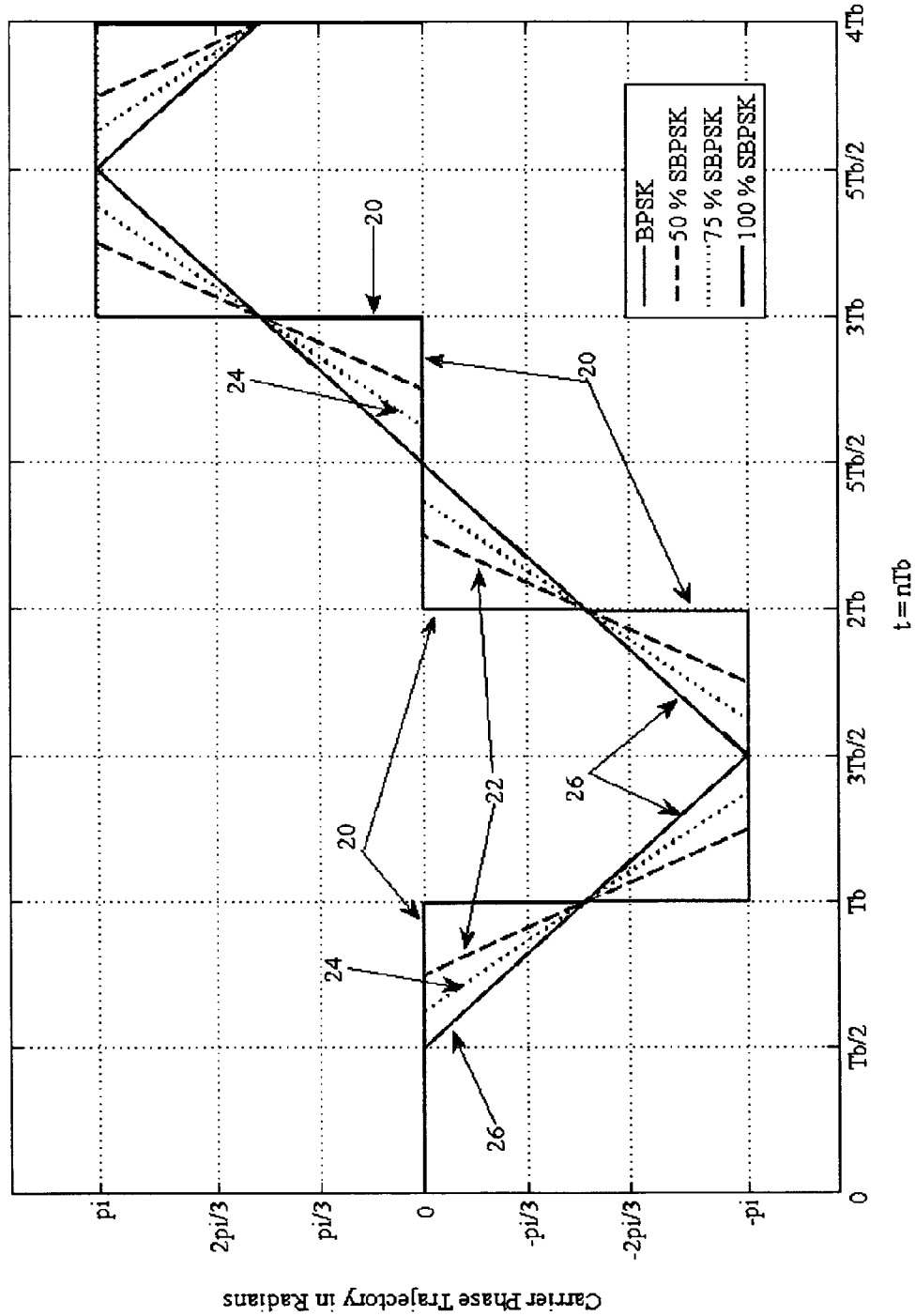
FIG. 3 is a diagram of phase transition as of an SBPSK signal.
Figure 4:
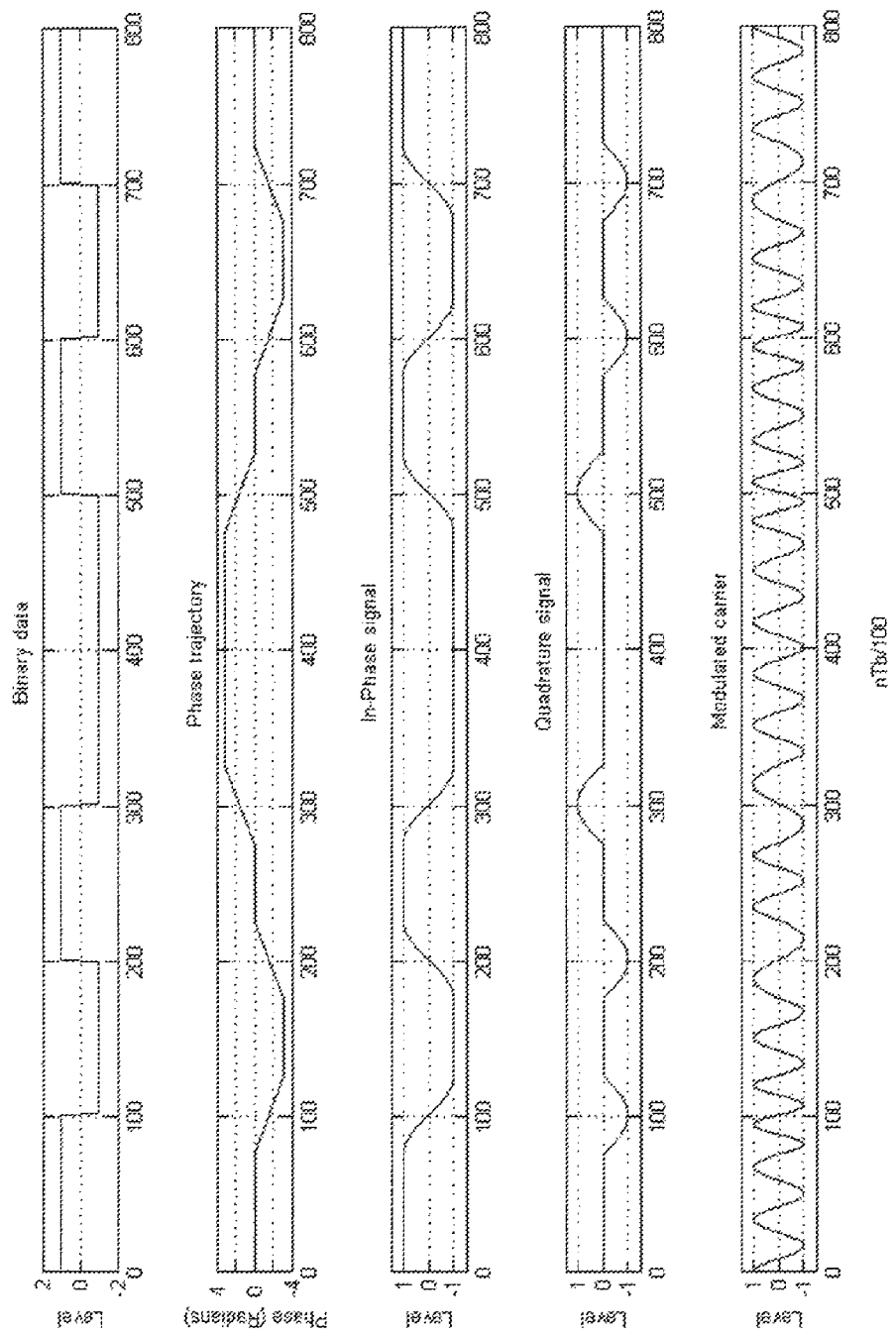
FIG. 4 is a diagram of various signals associated with a 50% shaping factor SBPSK signal.
Figure 5:
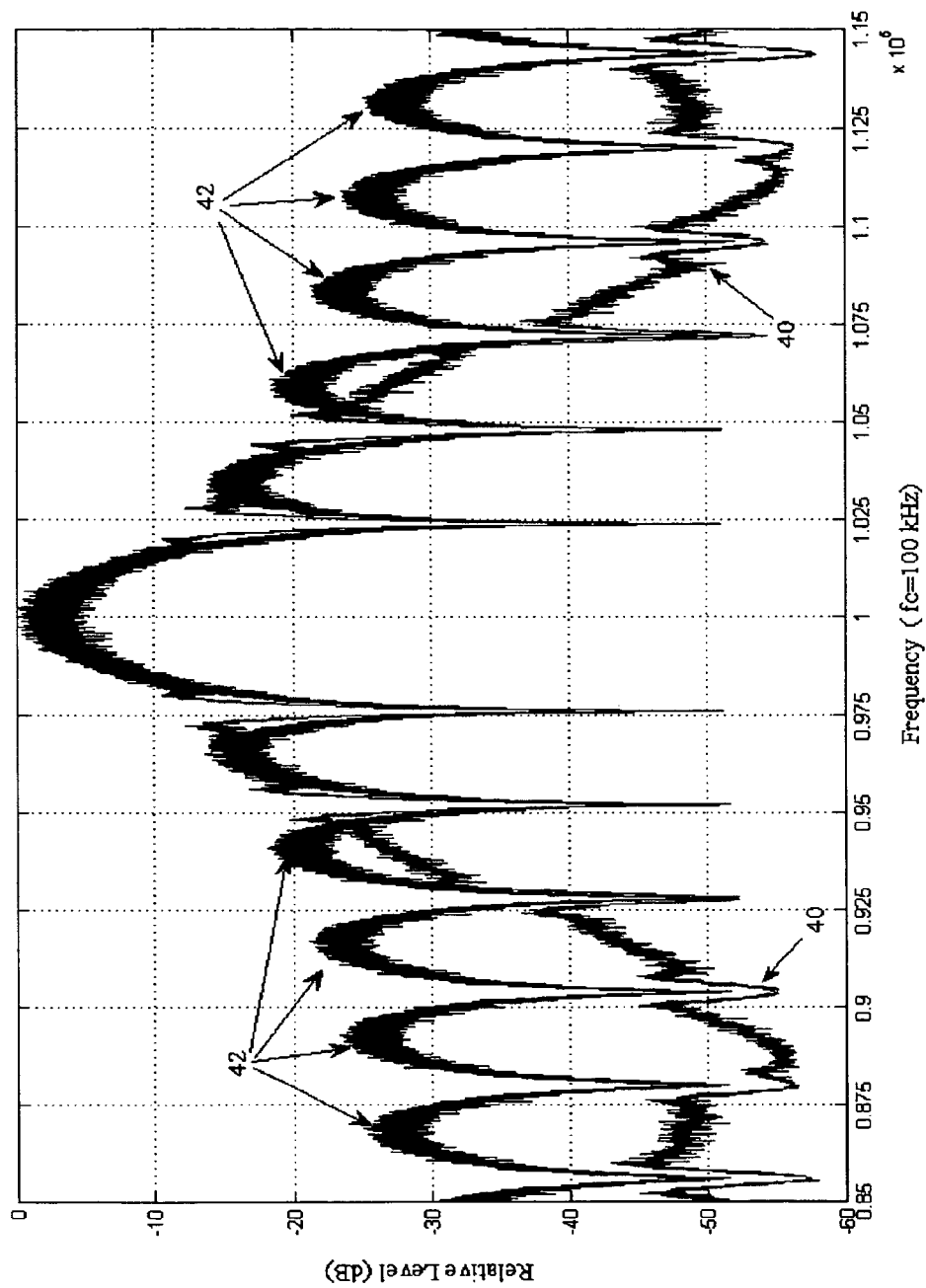
FIG. 5 is a diagram of the power spectral density of a BPSK signal and an SBPSK signal having a 50% shape factor.
Figure 6:
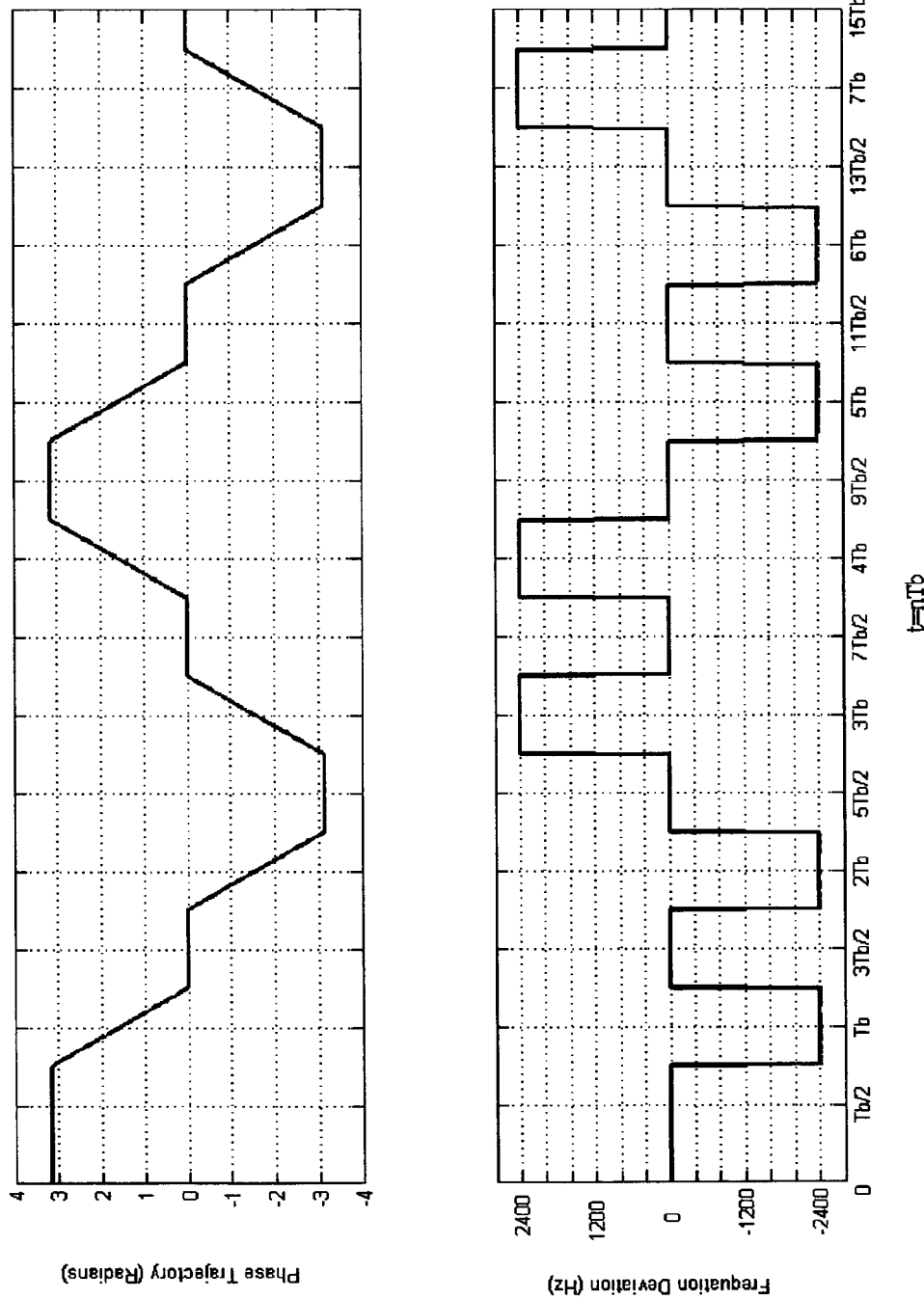
FIG. 6 is a diagram of the phase trajectory and the frequency deviation of an SBPSK signal.
Figure 8:
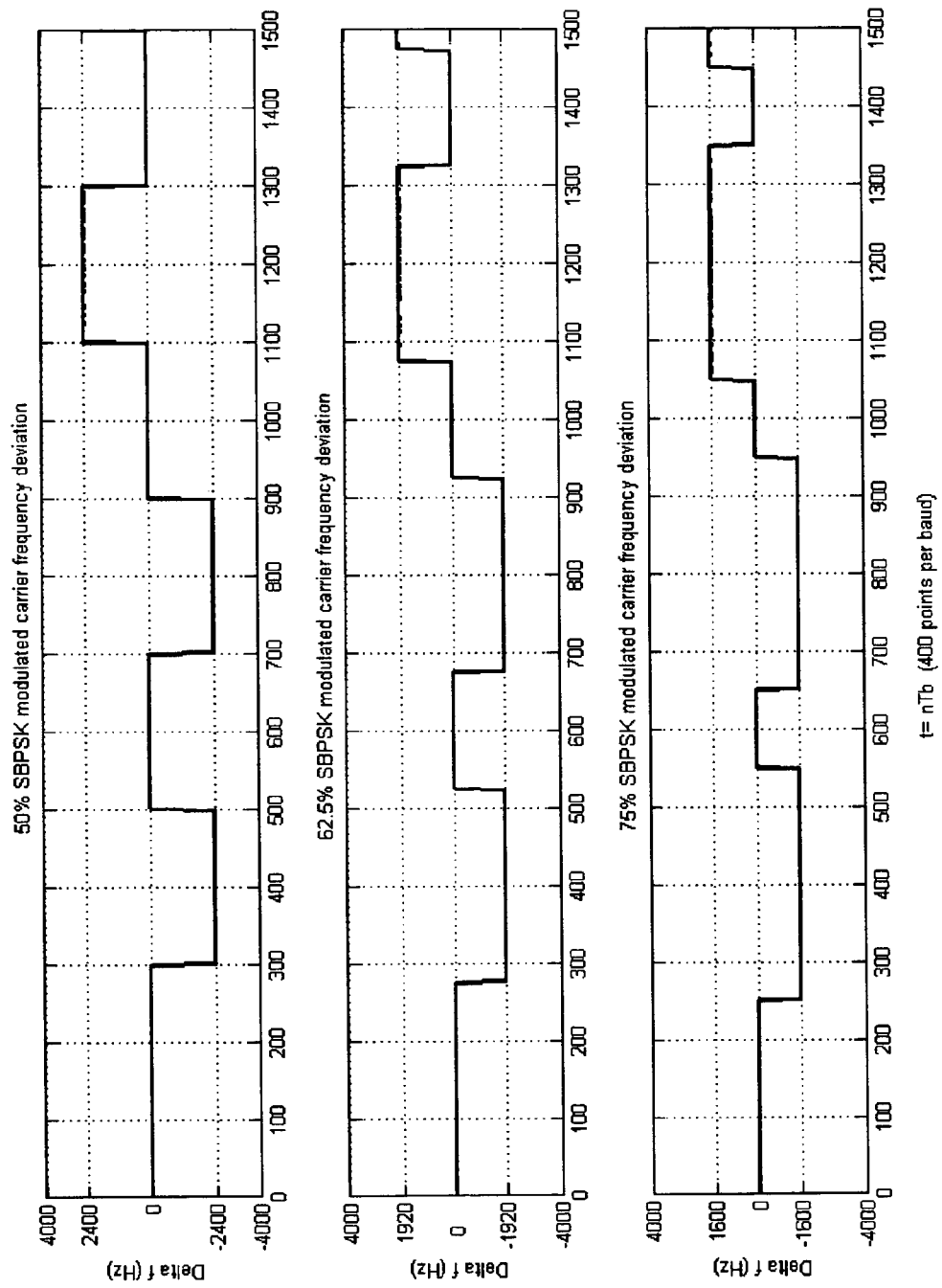
FIG. 8 is a diagram of the frequency deviations for 50%, 62.5% and 75% shaping factor SBPSK signal.
Figure 9:
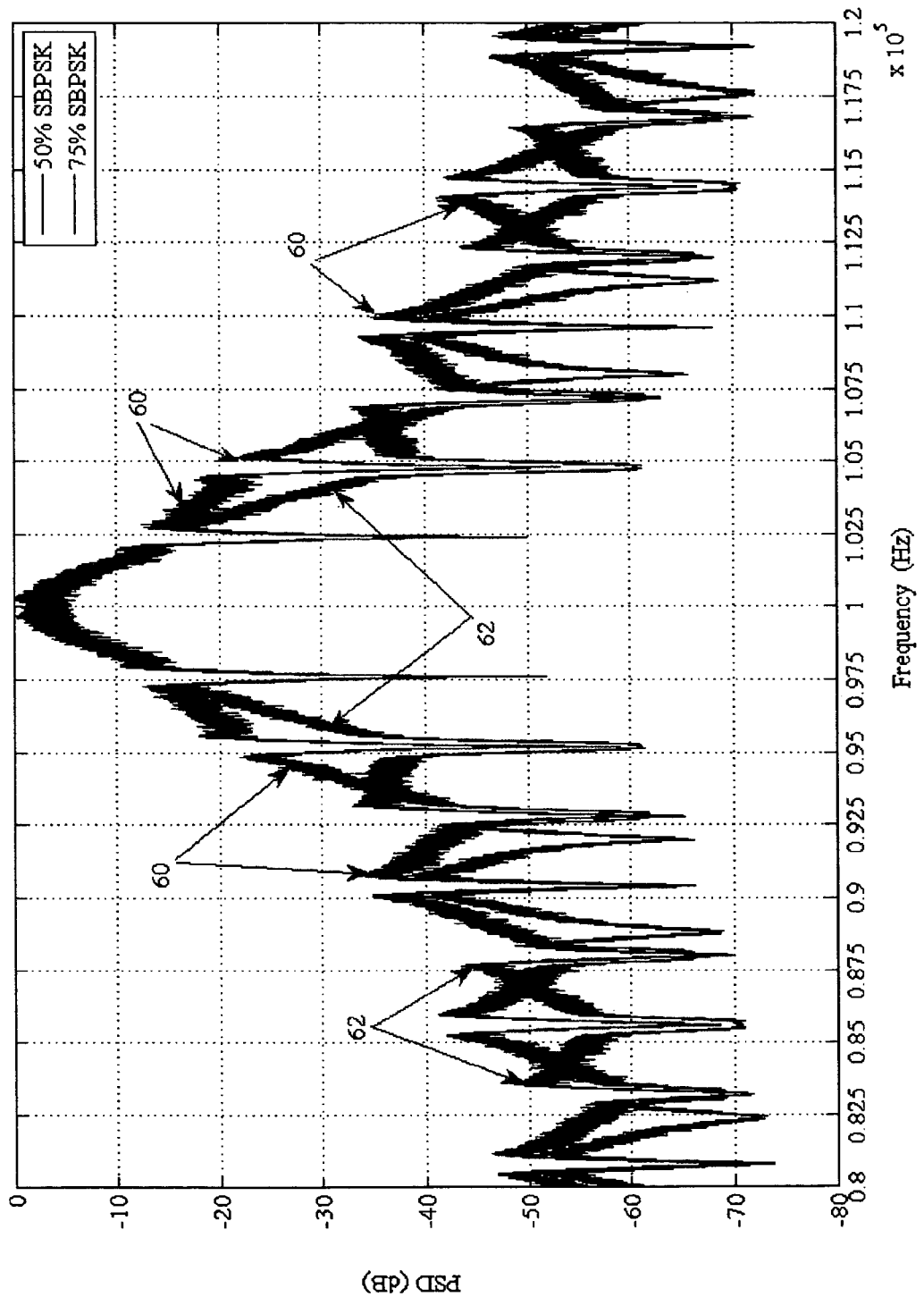
FIGS. 9 and 10 is a diagram of the power spectral density for 50% and 75% shaping factor SBPSK signals for different data rates.
Figure 10:
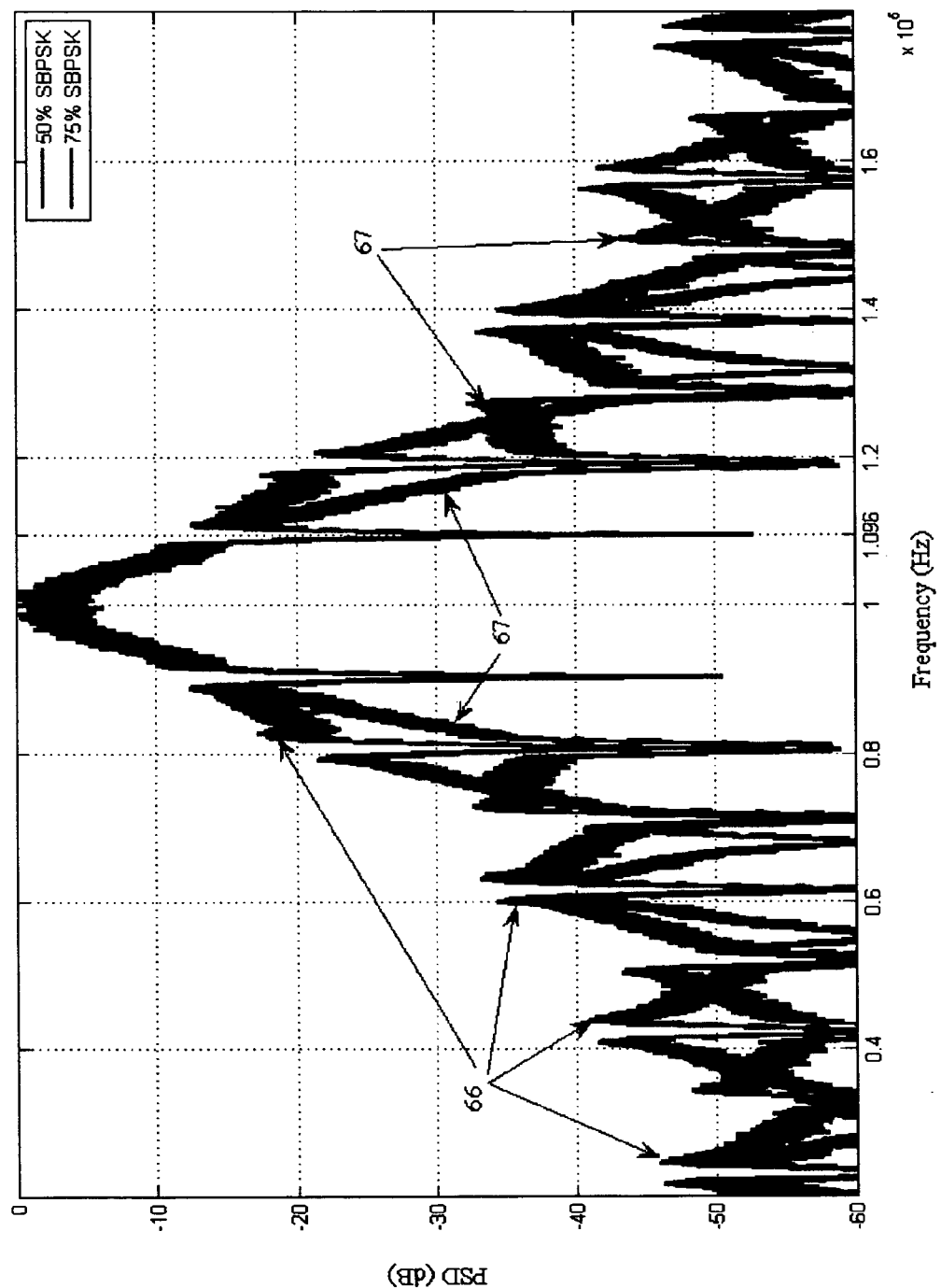
Figure 14:
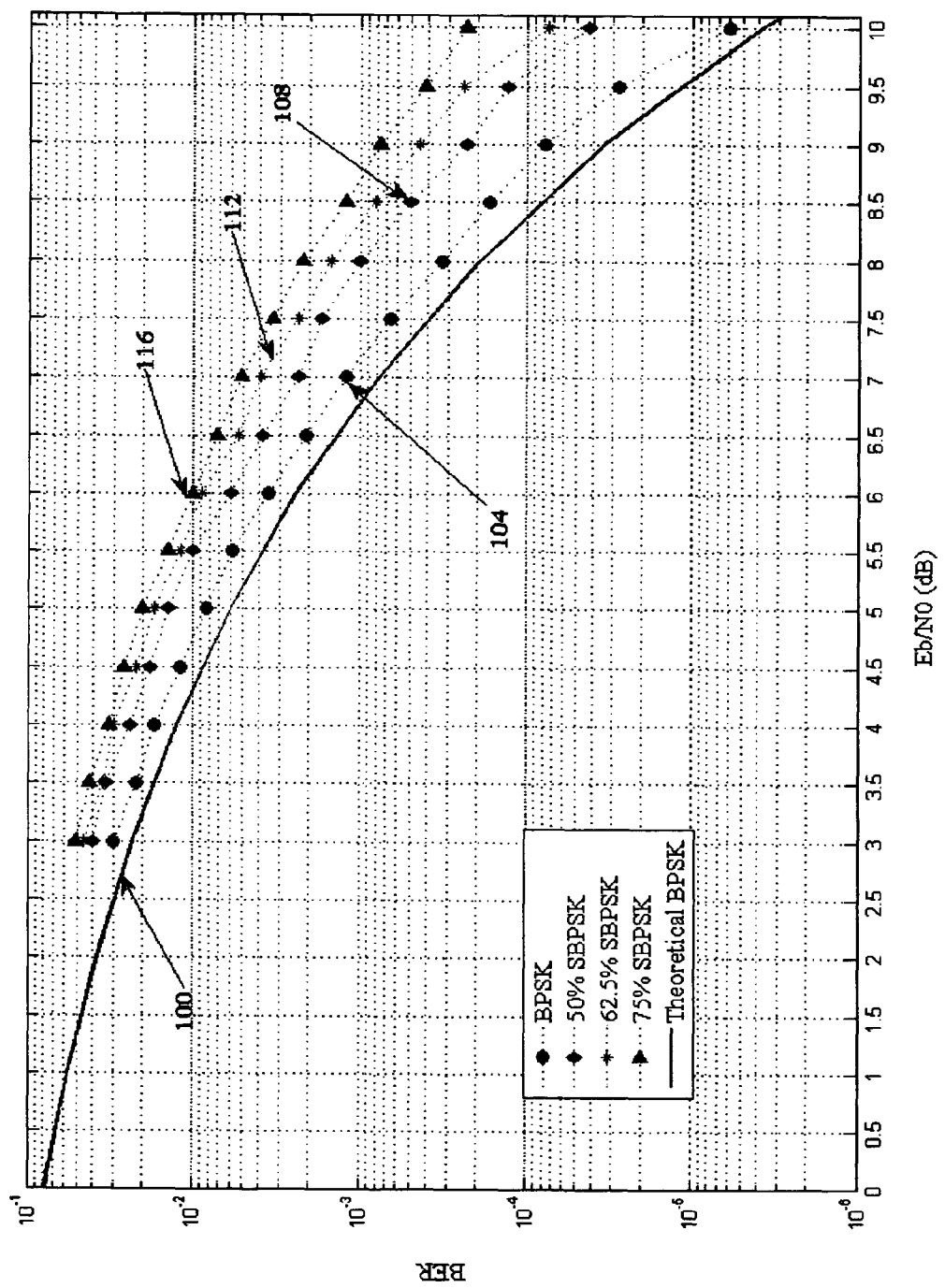
FIG. 14 is a diagram of a Eb/No versus bit error rate for SBPSK signals having different shaping factors.

Before describing in detail exemplary processes and apparatuses related to piecewise linear SBPSK modulation according to various embodiments of the present inventions, it should be observed that the present inventions reside primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the inventions.

The following embodiments are not intended to define limits of the structures or processes of the inventions, but only to provide exemplary constructions. The embodiments are permissive rather than mandatory and illustrative rather than exhaustive.

The present inventions teach a novel and non-obvious method and apparatus for controllably shaping the spectrum of a BPSK modulated signal by shaping the phase transitions according to one or more phase shaping functions, selected from a plurality of piecewise linear phase shaping functions. The resulting signal modulates a continuous time signal, such as a carrier signal for transmission over a communications channel. The resulting waveform, which has some features of a BPSK signal, presents reduced energy in frequency channels above and below the carrier frequency (that is, reduced ACE).

The phase shaping functions (defined by phase shaping parameters) of the inventions control the adjacent channel emissions by using a plurality of piecewise linear phase shaping functions in lieu of the prior art single linear shaping function. Thus the phase trajectory according to the present inventions comprises a plurality of different slopes for the phase trajectory during the phase shaping interval (e.g., 50%, 75% of the bit period). As further described below, the adjacent channel power reduction is achieved at low cost in terms of implementation loss as measured by the bit error rate performance at the receiver.

Further, the present inventions permit strategic redistribution of the adjacent channel emissions in prescribed adjacent channels by appropriate selection of one or more members from the family of piecewise linear (piecewise continuous) shaping functions. For example, for a 62.5% shaping factor, the piecewise linear SBPSK apparatuses and methods of the present invention improve the ACE performance, especially in the second adjacent channel (i.e., centered at 10 kHz in the 5 kHz narrowband mode at a data rate of about 2400 bps and centered at 50 kHz in the 25 kHz wideband mode at a data rate of about 9600 bps). When demodulated by a coherent BPSK demodulator, the implementation loss for the 62.5% shaping factor using the piecewise linear SBPSK (PWL SBPSK) approach of the present inventions is approximately the same as the implementation loss for a conventional prior art SBPSK signal with a 50% shaping factor, and the ACE performance of the PWL SBPSK is better than the ACE of the 50% SBPSK signal. Thus the present invention provides superior bit error performance and robust control of adjacent channel emissions.

The new phase transition shaping techniques of the present inventions use a piecewise linear approach to generate phase transitions. The phase transitions from zero to π are achieved by using multiple straight lines (at least two straight lines) with different slopes. There is no pronounced discontinuity in the phase trajectory during the transition interval, producing a carrier signal that resembles an M-ary frequency shift keying (FSK) waveform. Since the line slopes control the ACE characteristics of the transmitted signal, selecting the line slopes reshapes the power spectral density of the waveform as desired.

The phase transition interval can vary from zero to the full bit period, thus achieving any shaping factor from 0% to 100%. To achieve desired ACE characteristics, shaping functions can be selected and the resulting ACE predicted by a computer simulation model. The ACE and BER results can be verified by applying the shaping functions to a signal and measuring the resulting power spectral density. Computer simulation results show good agreement with measured experimental results in terms of both ACE characteristics and implementation loss. Different shaping factors, different line slopes and different number of lines can be selected to achieve the desired BER and ACE performance.

It is known that the linear 50% SBPSK of the prior art has an ACE margin (relative to the applicable ACE standards) of about 1.7 dB in the 10 kHz offset adjacent channel at 2400 bps in the narrowband mode. See FIG. 11. In the wideband mode at 9600 bps data rate this margin is about 1.6 dB in the 50 kHz offset channel. See FIG. 13. At the 4800 bps data rate there exists a relatively large ACE margin, for obvious reasons (when used in the 25 kHz channel mode the null bandwidth of its PSD is at ±4800 Hz). The present inventions present an alternative to the prior art technique of increasing the shaping factor to reduce the ACE and suffering the associated implementation loss, since the present inventions can reduce the ACE with less detrimental affect on the implementation loss.

Using the phase shaping functions of the present invention, the phase transitions from 0 to ±180 degrees and vise versa at multiple slopes during the phase transition interval while maintaining a continuous phase transition. Thus the resulting phase transition is piecewise linear from 0 to ±180 degrees and vise versa.

The methods and apparatuses of the inventions use shaping functions with any desired slopes to shape the PSD and thus control the ACE performance as desired. The resulting phase transitions produce an M-ary-like (with M>3) continuous-phase frequency shift keying (CPFSK) waveform when implemented digitally with an NCOM. In one embodiment, the invention uses a three-sloped-phase transition over ½ of the bit interval. When the frequencies represented by the phase transitions are produced by an NCOM, the resulting signal comprises five different frequencies. In a modulated carrier embodiment the five frequencies comprise a carrier frequency and two deviation frequencies from the carrier frequency, where the two deviation frequencies are each added to and subtracted from the carrier frequency to yield the five different frequency values. Those skilled in the art are aware of other techniques and apparatuses for creating the different frequencies, including use of a digital signal processor.

Figure 15:
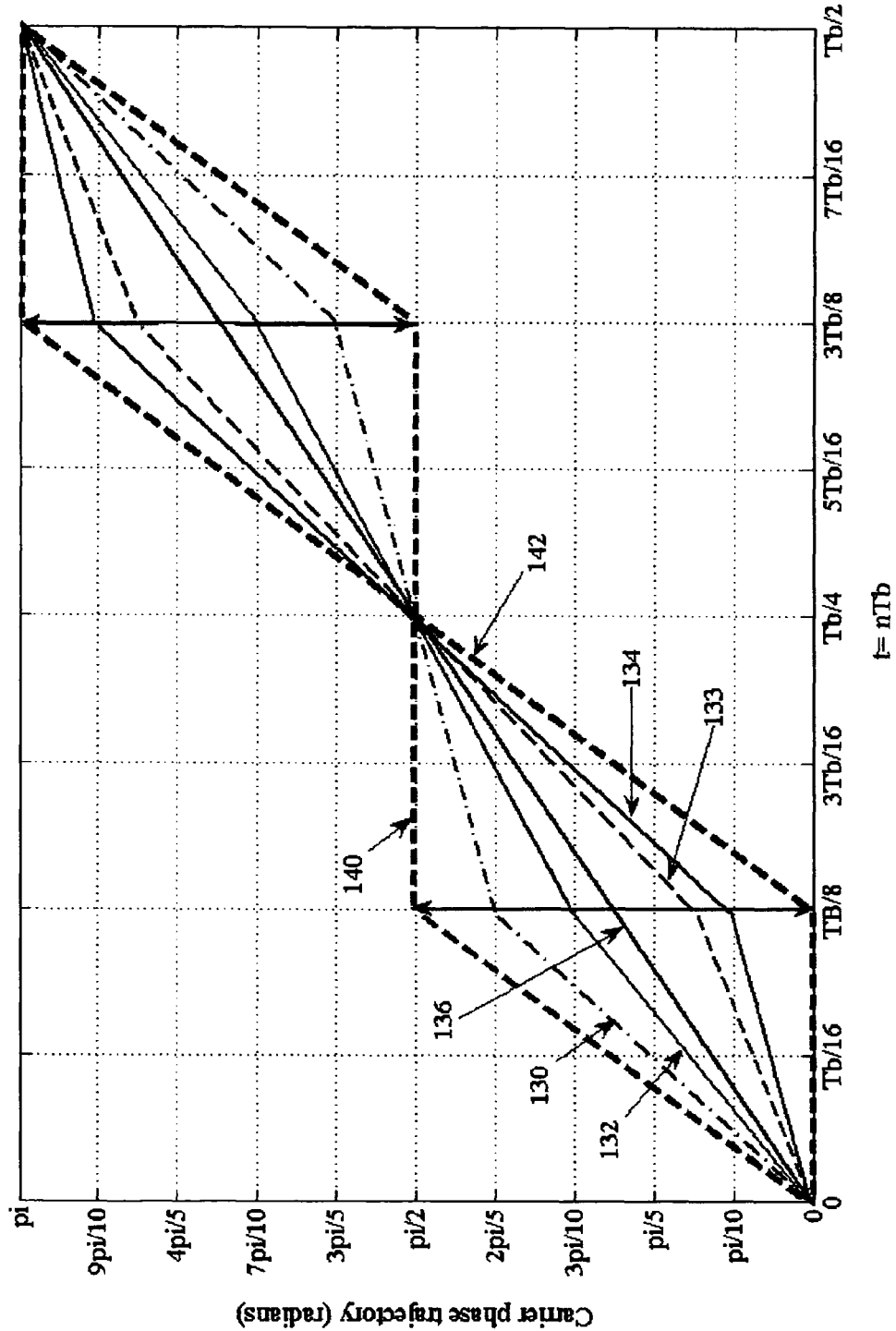
FIG. 15 is a diagram of exemplary phase trajectories for 50% PWL_SBPSK phase transtions according to the present inventions.

Four exemplary members of three-slope piecewise linear SBPSK (PWL SBPSK) phase transitions are depicted in FIG. 15 for the 50% shaping factor case (illustrated as transitioning over one-half of a bit period (bit duration) from 0 to Tb/2), bearing reference characters 130, 132, 133 and 134. Note that each shaping factor transitions through three different phase changes or line slopes (and thus three different frequencies) during the transition period. The teachings of the invention can be applied to any shaping factor from 0% to 100% (fractional portions of the bit period) and any number of piecewise linear phase transitions (that is, any number of sloped lines) of any slope can be used to transition the phase during the shaping interval. The shaping interval can extend over any portion of the bit interval, such as one-half or one-quarter of the bit interval. The exemplary 50% shaping factors transitions illustrated in FIG. 15 each extend over one-half of the bit interval. The shaping slopes can also extend over any carrier phase trajectories; the phase trajectories set forth on the ordinate being merely examples. A curve 136 in FIG. 15 represents the prior art single slope SBPSK signal.

When implemented using the NCOM, the frequency changes for the three-slope 50% shaping factor transitions as illustrated in FIG. 15 occur at ⅛ the baud (or bit) rate. Thus a clock running at ⅛ the baud rate triggers the frequency changes associated with the three slopes during the phase transition interval. In the exemplary three slope embodiment of FIG. 15 the first and third slopes are equal, although the inventions are not limited to a three-slope phase transition having equal first and third slopes.

There is a region, bounded by dashed curves 140 and 142, outside of which solutions do not exist, since a phase transition endpoint at Tb/2 cannot be reached if any of the piecewise linear slopes are outside the curves 140 and 142.

Each of the sloped curves 130, 132, 133 and 134 of FIG. 15 redistributes the spilled energy differently into the various adjacent channels. For instance, it has been determined that when the first of the three slopes is greater than the SBPSK slope as represented by the curve 136, the ACE margin in the first adjacent channel increases (i.e., the ACE in the first adjacent channel decreases) while the ACE margin in the remaining adjacent channels decreases. Curves 130 and 132 have slopes greater than the SBPSK slope curve 136. When the first of the three slopes is smaller than the SBPSK slope of the curve 136, the ACE margin in the first adjacent channel decreases and the ACE margin in the other adjacent channels increases. Curves 133 and 134 have slopes less than the slope of the SBPSK slope curve 136. Thus judicious selection of the slopes during the phase transition interval can create desired ACE characteristics.

Since the second adjacent channel in both the narrowband and the wideband SATCOM channels requires more ACE margin to comply with the MIL-STD-188-181A, in one embodiment the curve 133 of the piecewise-linear family of curves is chosen to optimize the ACE margin in the second adjacent channel.

As can be seen from FIG. 15, the phase trajectory of the piecewise linear SBPSK (PWL SBPSK) signal includes multiple distinct linear segments that span the phase transition period, which is equal to a product of the shape factor and the bit period. In one embodiment as illustrated by the shaping factors of FIG. 15, the first and third segments of the three-slope embodiment have equal slopes, while the middle segment has a different slope. The middle segment slope is greater than the slope of the first and third segments for the curves 133 and 134 and less than the slope of the first and the third segments for the curves 130 and 132. The two distinct slopes create two distinct frequency deviations $\Delta f_1$ and a $\Delta f_2$.

The resulting modulated carrier signal responsive to the PWL SBPSK signal comprises frequencies $f_c$, $f_c+\Delta f_1$, $f_c-\Delta f_1$, $f_c+\Delta f_2$, $f_c-\Delta f_2$.

Figure 16:
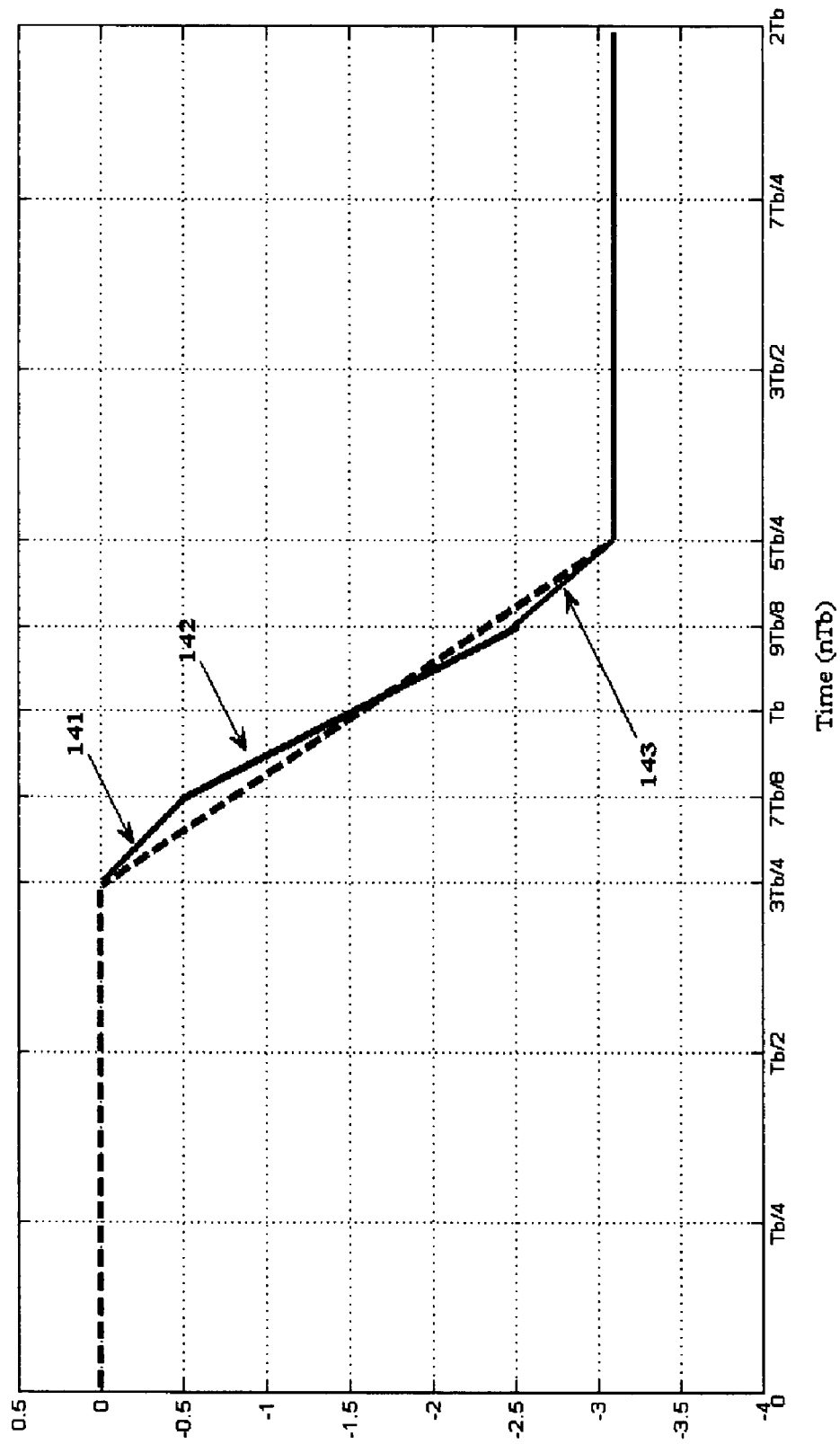
FIG. 16 is a diagram of a phase trajectory according to one embodiment of the present invention.

FIG. 16 illustrates exemplary phase transitions for a 50% shaping factor transition from a voltage representing a 1 bit to a voltage representing a 0 bit. Note that a bit prior to the 1 bit (i.e., prior to time 0) is also a 1 bit (i.e., two successive 1 bits) thus there is no phase transition between the two 1 bits. Since the example presents a 50% shaping factor, the last quarter interval of the second 1 bit and the first quarter interval of the 0 bit are shaped resulting in a total shaping interval of 50% of the bit duration Tb. Prior to the beginning of the phase shaping interval the frequency is $f_c$. A line segment 141 extends from 3Tb/4 to 7Tb/8 representing a frequency $f_c+\Delta f_1$. A second line segment 142 having a different slope than the line segment 141 extends from time 7Tb/8 to Tb (the end of the second 1 bit) and represents a frequency $f_c+\Delta f_2$. The line segment 142 further extends to the time 9Tb/8 as illustrated. A line segment 143 having the same slope as the line segment 141 begins at 9Tb/8 and terminates at 5Tb/4. Thus the frequency represented by the line segment 143 is $f_c+\Delta f_1$. At 5Tb/4 the phase transition interval ends and the frequency returns to $f_c$. During a subsequent transition from the 0 bit to a 1 bit the piecewise linear slopes are opposite in sign to the slopes of the line segments 141, 142 and 143. Thus the representative frequencies are $f_c$, $f_c-\Delta f_1$, $f_c-\Delta f_2$.

In other embodiments not illustrated a greater number of line segments span the phase transition interval in a piecewise linear fashion. Also, in other embodiments the phase transition interval can be longer or shorter than 50% of the bit duration Tb.

Figure 17:
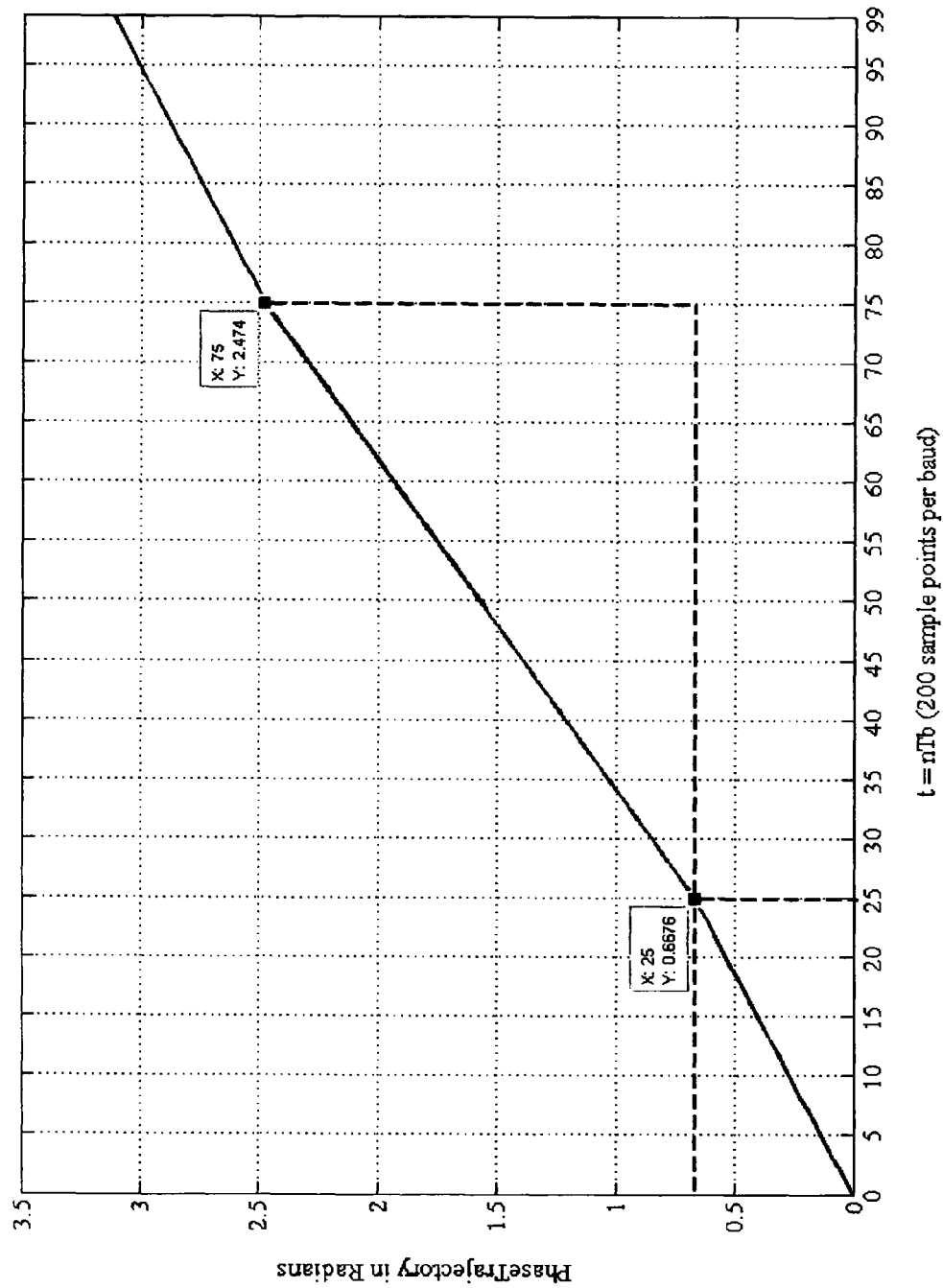
FIG. 17 is a diagram of phase trajectories for PWL-SBPSK of the present invention.

Exemplary phase trajectories for PWL-SBPSK are shown in FIG. 17. The two frequency deviations $\Delta f_1$ and $\Delta f_2$ of the PWL SBPSK modulated carrier are the derivatives with respect to time of a first segment and a second segment of the exemplary three segment instantaneous phases according to:

$$\Delta f_1 = \frac{\Delta \omega_1}{2\pi} = \frac{1}{2\pi} \frac{d\phi_1(t)}{dt}$$

$$\Delta f_2 = \frac{\Delta \omega_2}{2\pi} = \frac{1}{2\pi} \frac{d\phi_2(t)}{dt}$$

The two frequency offsets are given by:

$$\Delta f_1 = \frac{0.6676}{2\pi \times SF \times T_b/4} = \frac{0.6676 \times 4 \times R_b}{2\pi \times SF}$$

$$\Delta f_2 = \frac{(2.474 - 0.6676)}{2\pi \times SF \times 2 \times T_b/4} = \frac{1.8064 \times 4 \times R_b}{4\pi \times SF}$$

where $R_b=1/T_b$ is the bit rate and SF is the shape factor.

Figure 18:
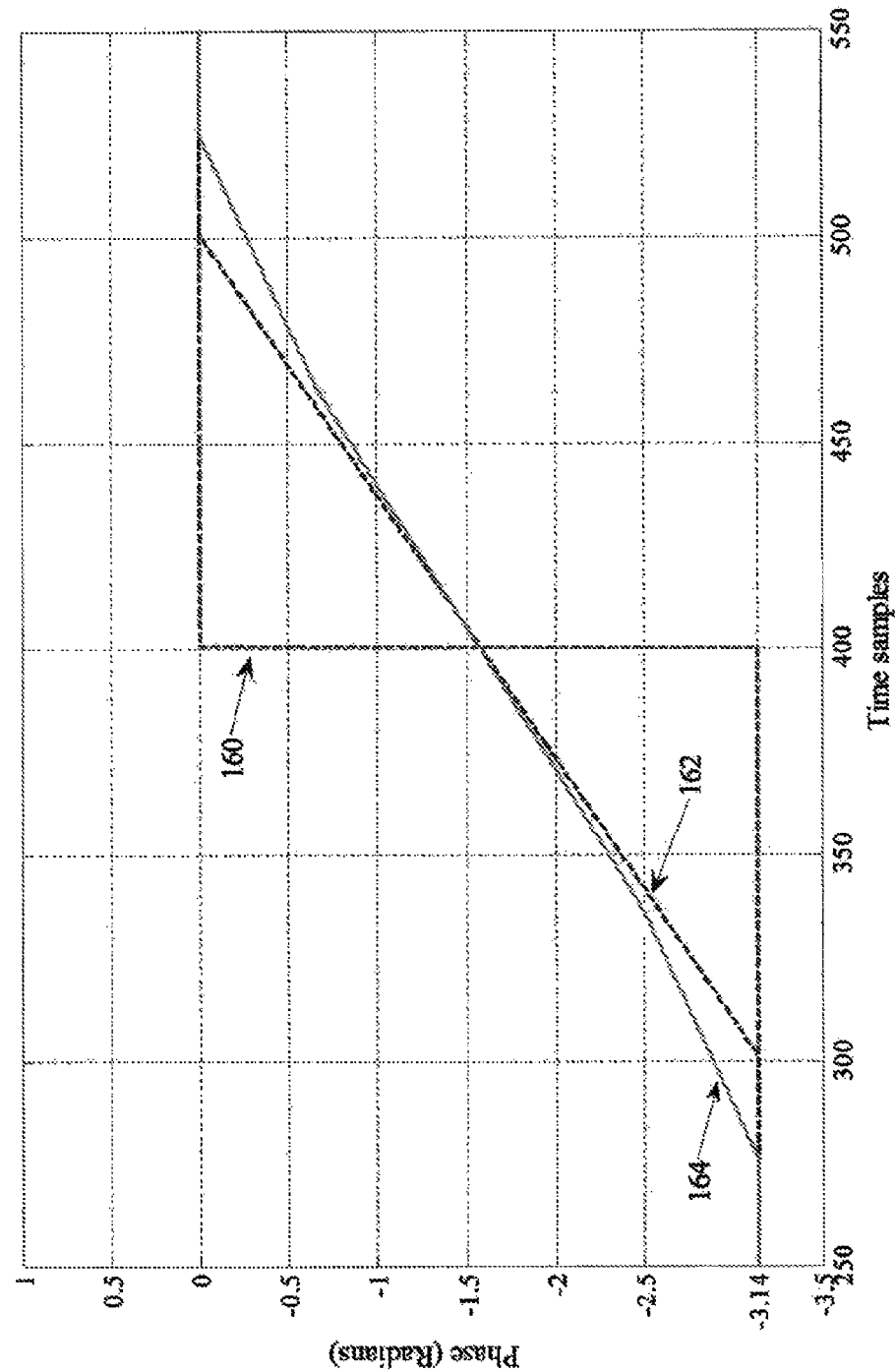
FIG. 18 is a diagram of phase trajectories of prior art BPSK and 50% and 62.5% PWL SBPSK of the present inventions.

FIG. 18 depicts the phase transitions for BPSK (a curve 160), 50% SBPSK (a curve 162) and an exemplary 62.5% PWL SBPSK according to the present inventions (a curve 164).

Figure 19:
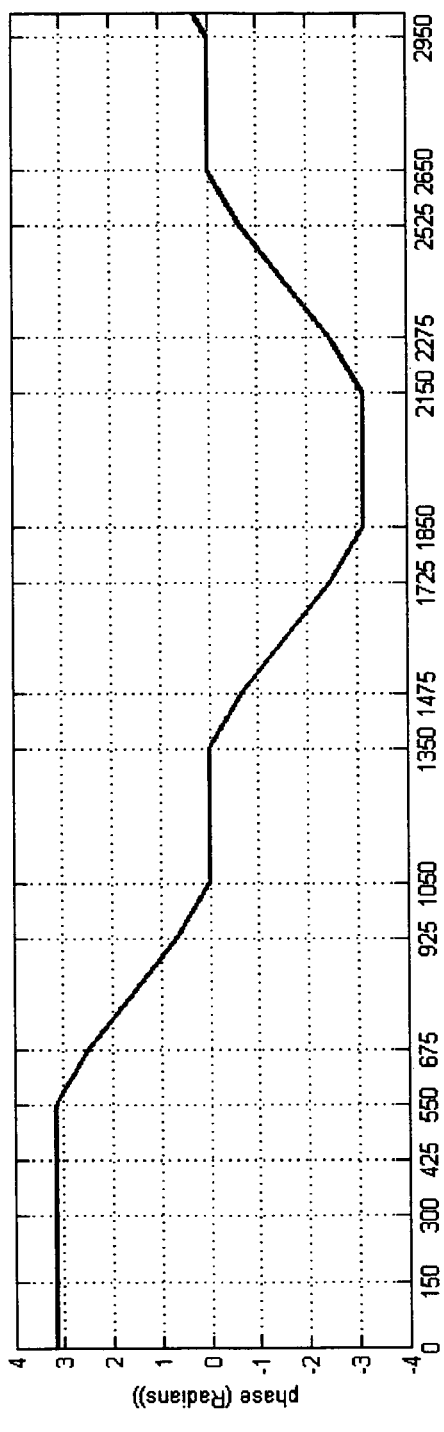
FIG. 19 is a diagram of a phase trajectory and frequency deviations of PWL SBPSK of the present inventions.
Figure 19:
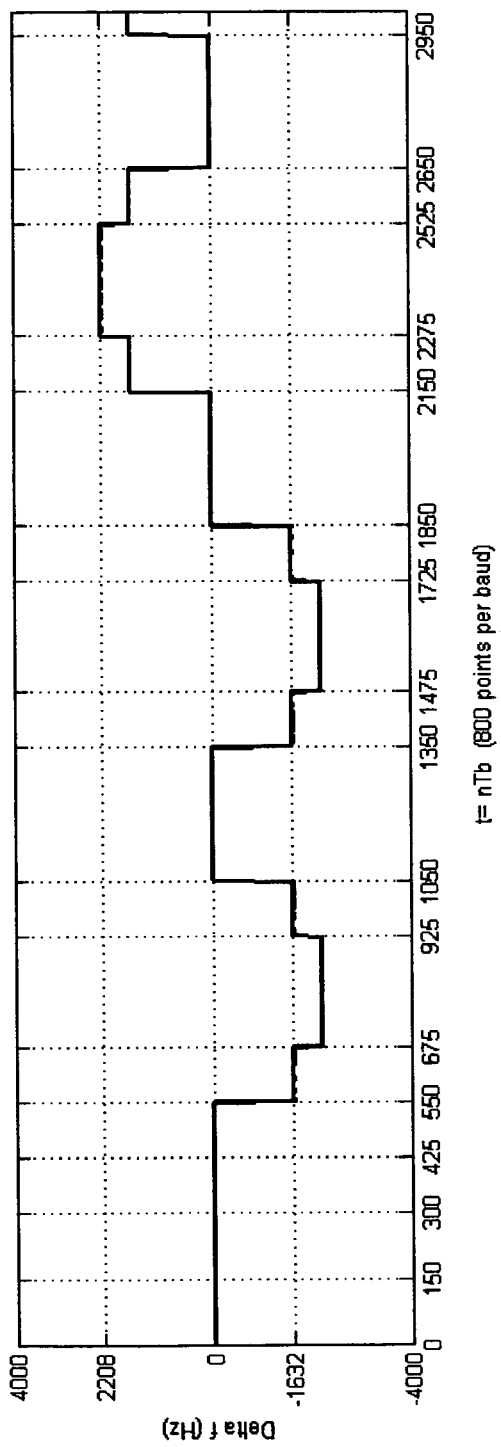

FIG. 19 depicts a phase trajectory and corresponding frequencies for PWL SBPSK having a shaping factor of 62.5% according to the present inventions.

Values of $\Delta f_1$ and $\Delta f_2$ as a function of the shape factor are computed from the slopes in FIG. 17 and are summarized in FIG. 20 for 2400 and 9600 bps data rates.

Figure 21:
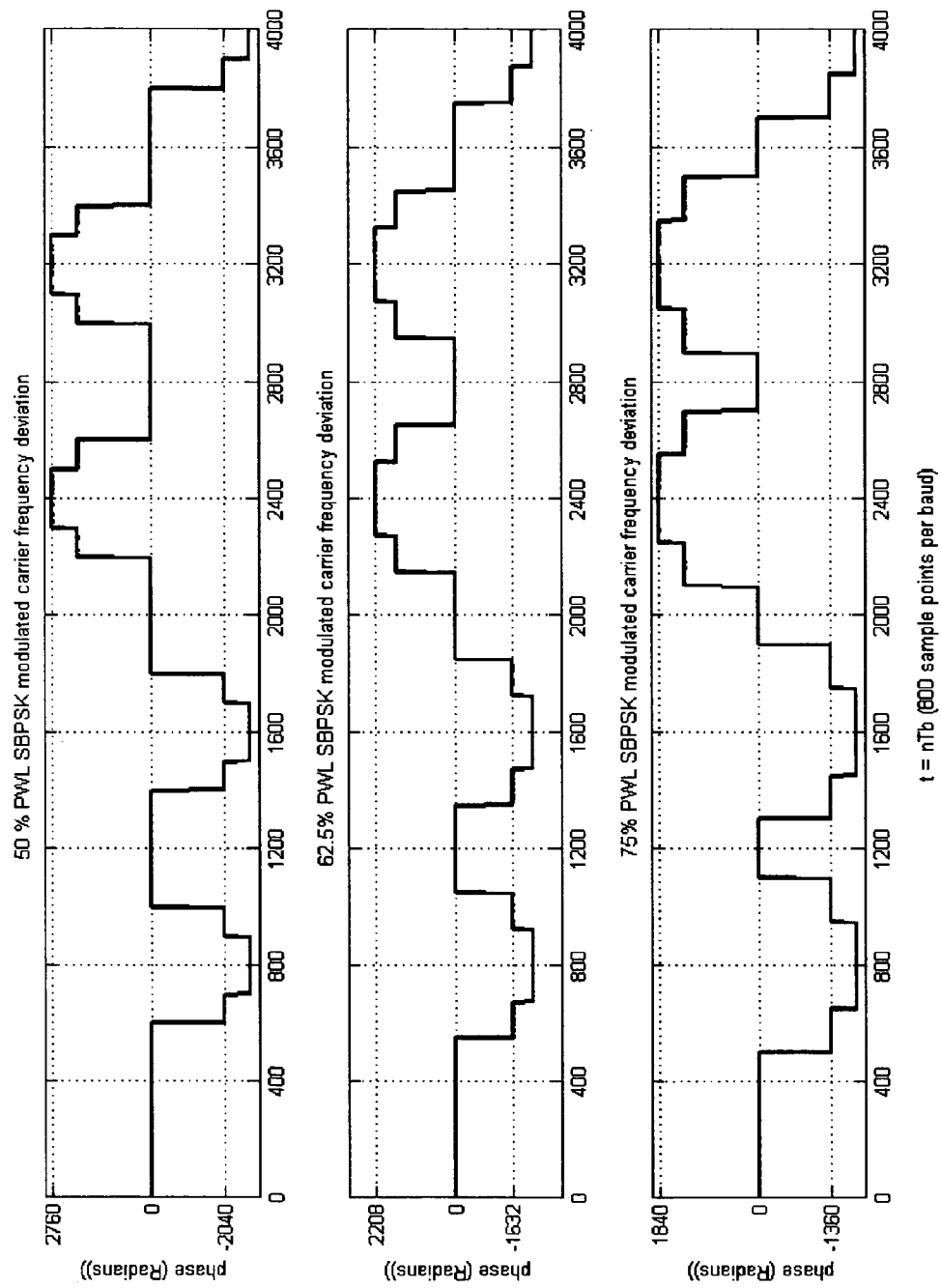
FIG. 21 is a diagram of the carrier frequency peak frequency deviations for 50%, 62.5% and 75% PWL SBPSK at a 2400 bps data rate

For instance, the five frequencies for 50%, 62.5% and 75% PWL SBPSK of the present inventions are respectively given by {-2040, 2040, -2760, 2760 and 0 Hz}, {-1632, 1632, -2208, 2208 and 0 Hz} and {-1360, 1360, -1840, 1840 and 0 Hz}. The carrier peak frequency deviations for 50%, 62.5% and 75% PWL SBPSK at 2400 bps are depicted in FIG. 21.

Figure 22:
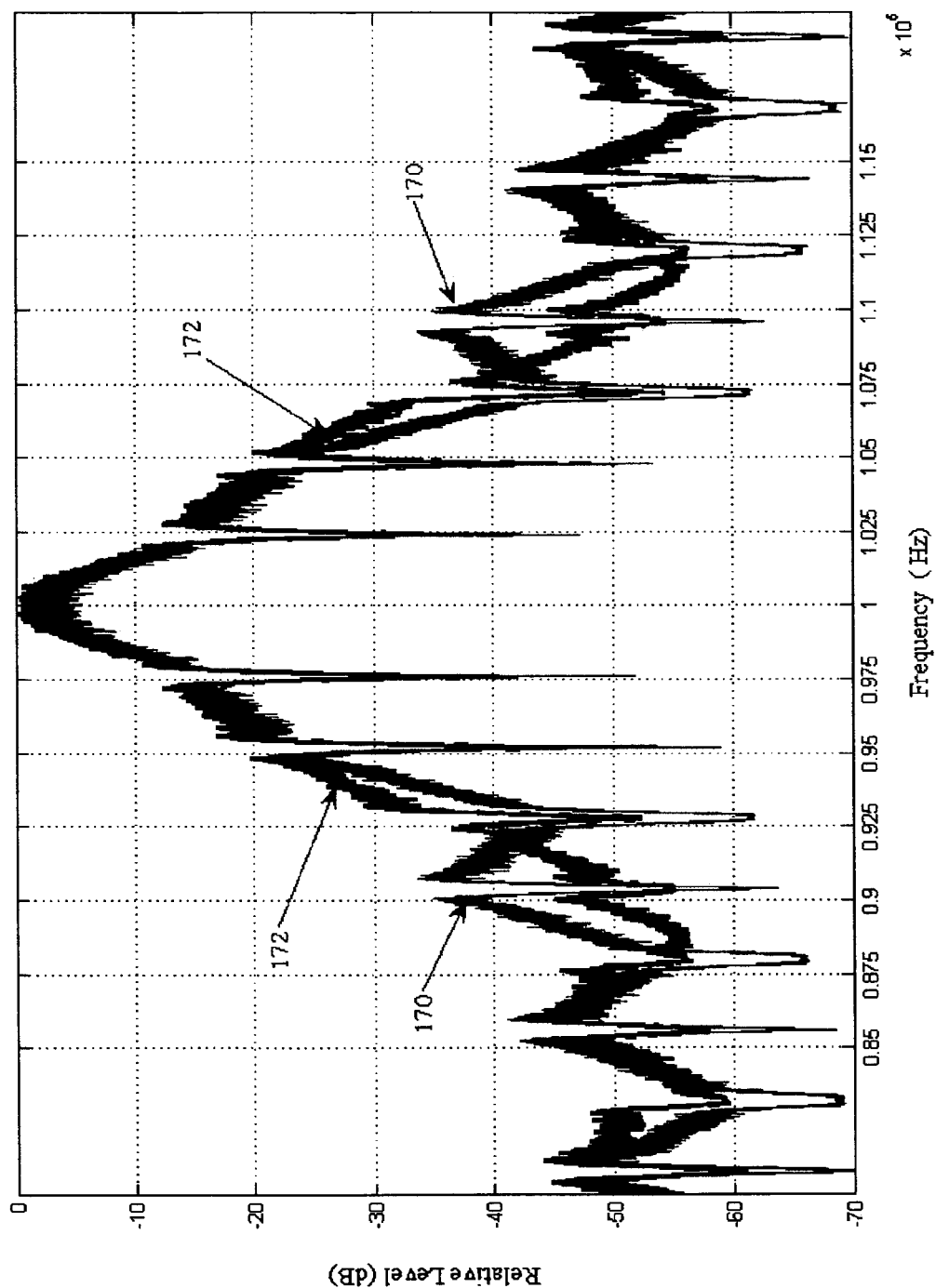
FIG. 22 is a diagram of a simulated power spectral density for 50% SBPSK and 50% PWL-SBPSK at 9600 bps.

The ACE improvement achieved by the present inventions is illustrated in simulated results presented in FIG. 22 where a curve 170 represents the spectral content of a 50% SBPSK signal and the curve 172 represents the spectral content of a 50% PWL-SBPSK signal of the present inventions, at a common data rate of 9600 bps. As shown, the PWL-SBPSK technique of the present inventions redistributes the spectral content from the SBPSK prior art signal. Note especially the reduced energy in the third and fourth adjacent channels. The amount and destination of the transferred energy is responsive to the specific curve slopes selected for the PWL SBPSK curves. Any number of slopes can be used during the phase transition interval, limited only by the capability of the hardware and/or software elements to process slope-induced phase transitions during the interval, where the length of the interval is directly related to the bit rate.

Figure 23:
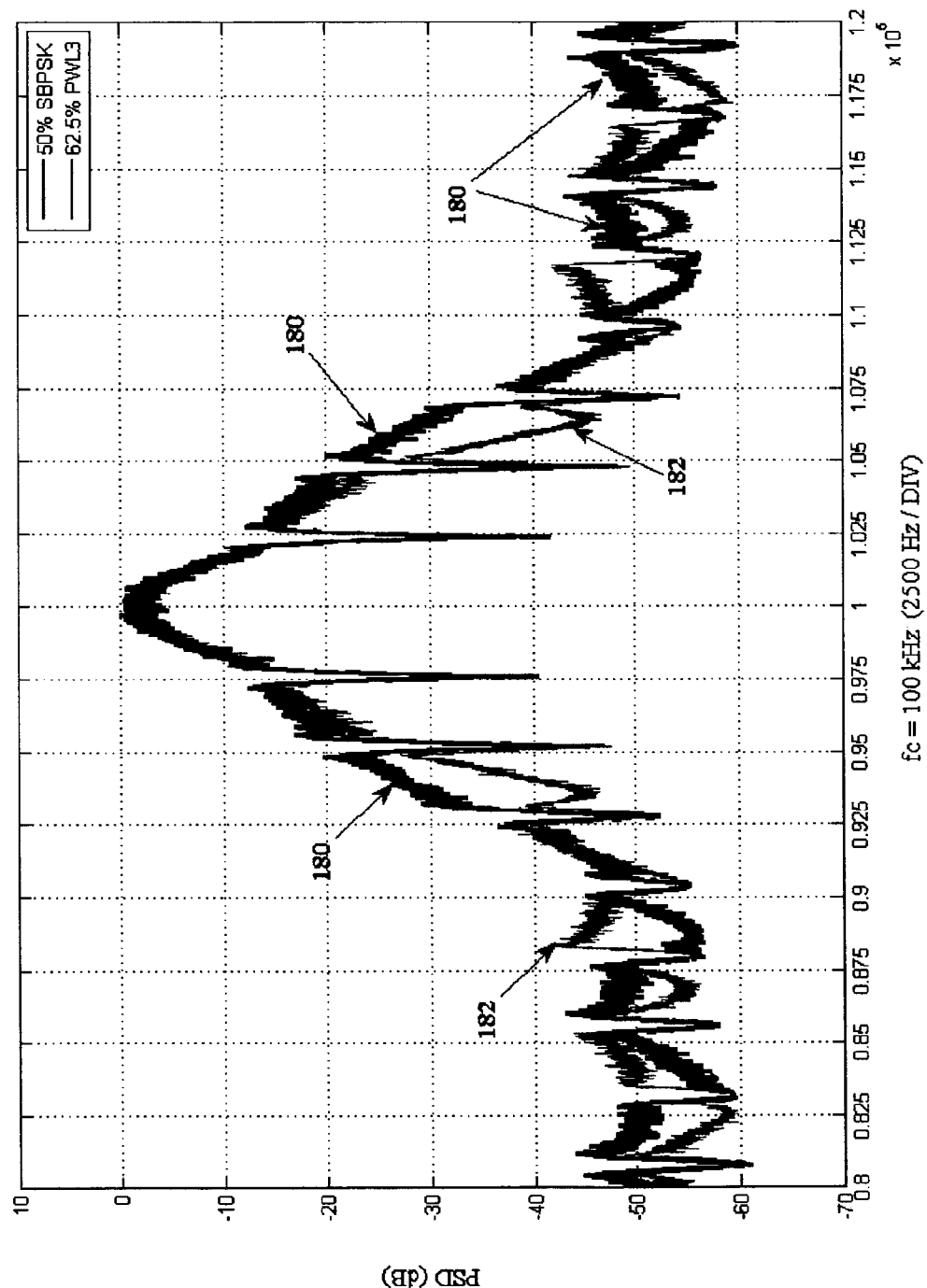
FIG. 23 is a diagram of a simulated power spectral density for 50% SBPSK and 62.5% PWL-SBPSK at 2400 bps.

FIG. 23 illustrates simulated results of the spectral content for a 50% SBPSK signal (a curve 180) and a 50% PWL-SBPSK signal (a curve 182), both at 2400 bps.

Figure 24:
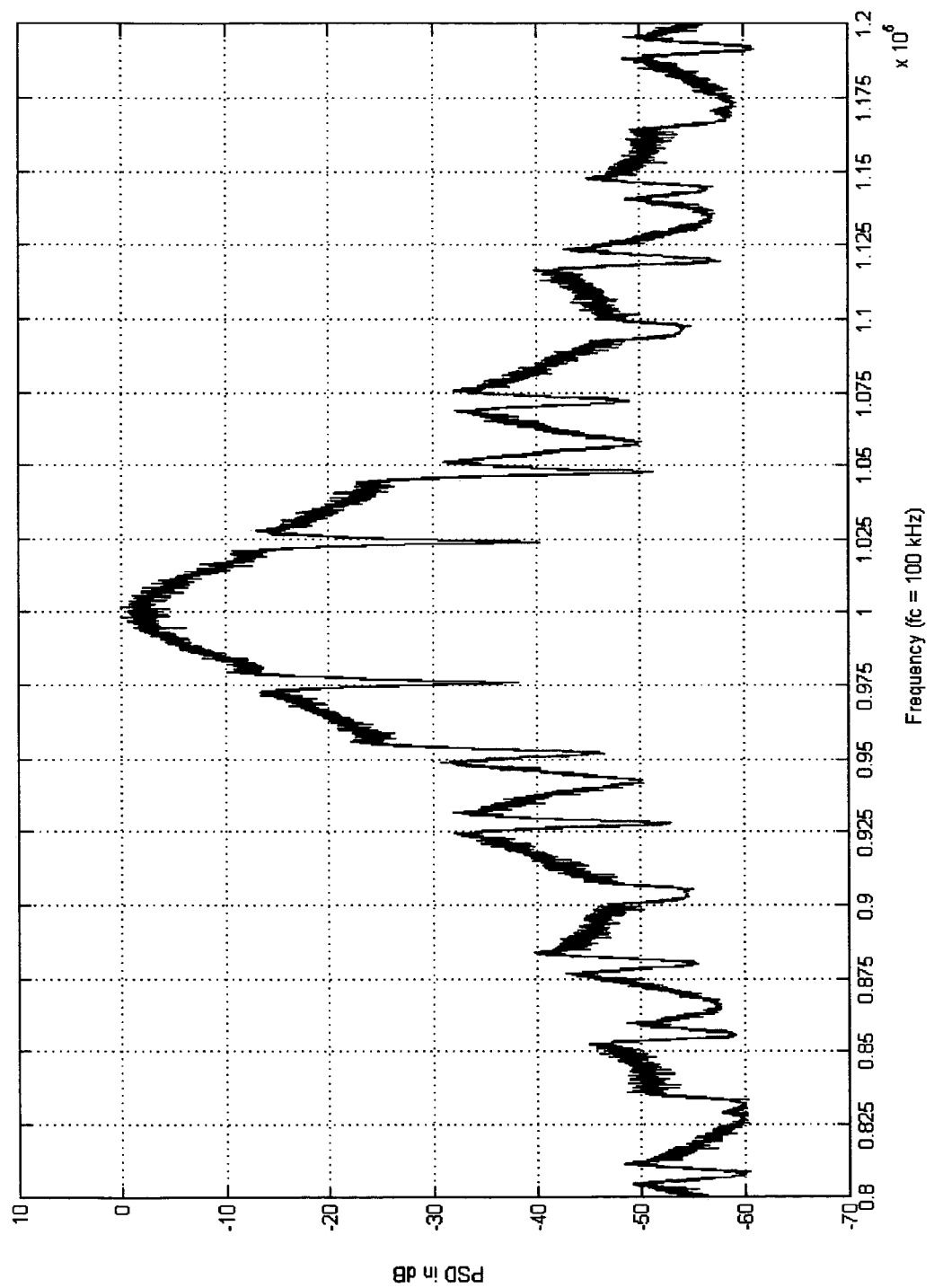
FIGS. 24-26 are simulated power spectral densities for 62.5% PWL-SBPSK at 2400, 4800 and 9600 bps respectively.
Figure 25:
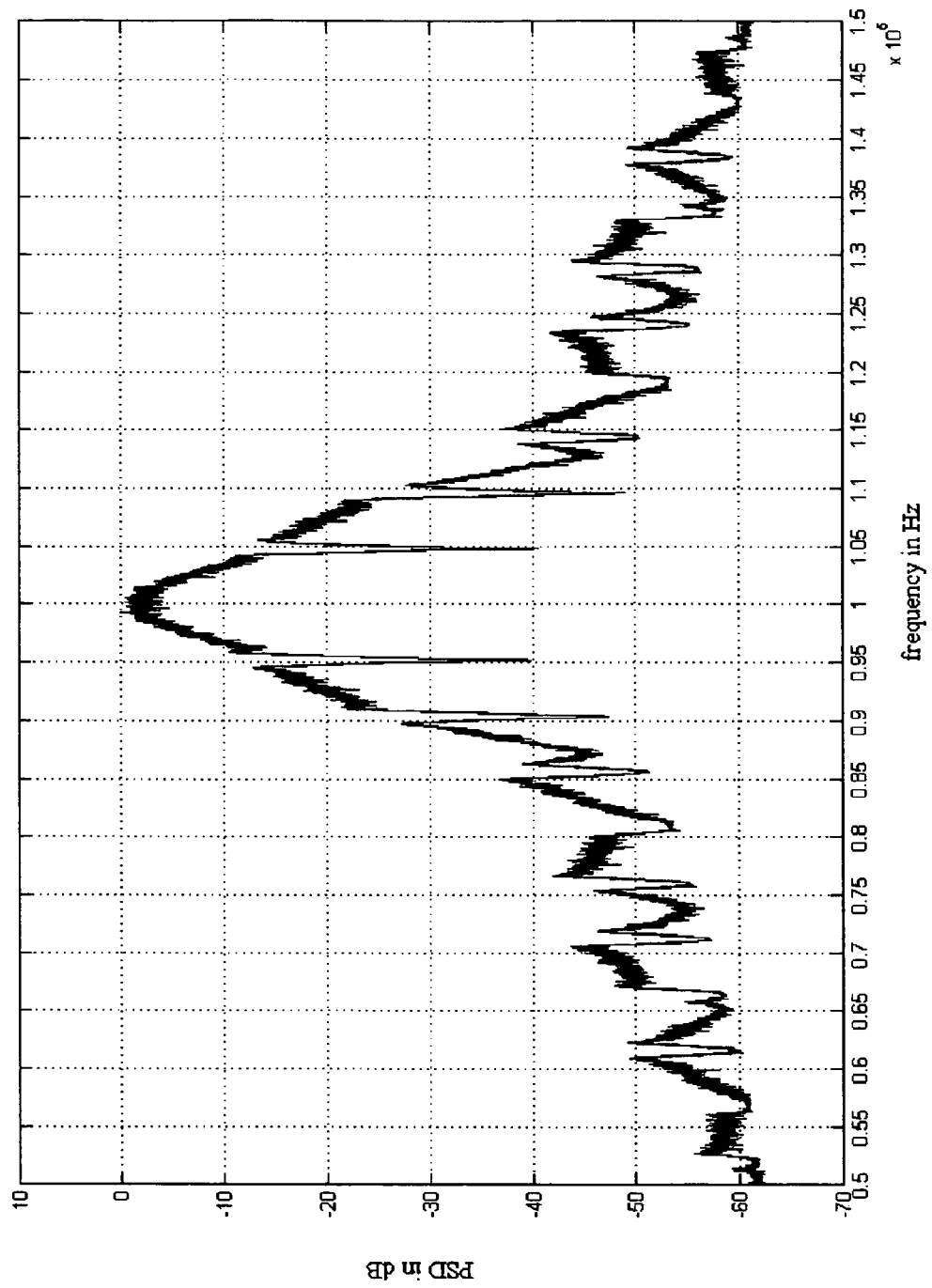
Figure 26:
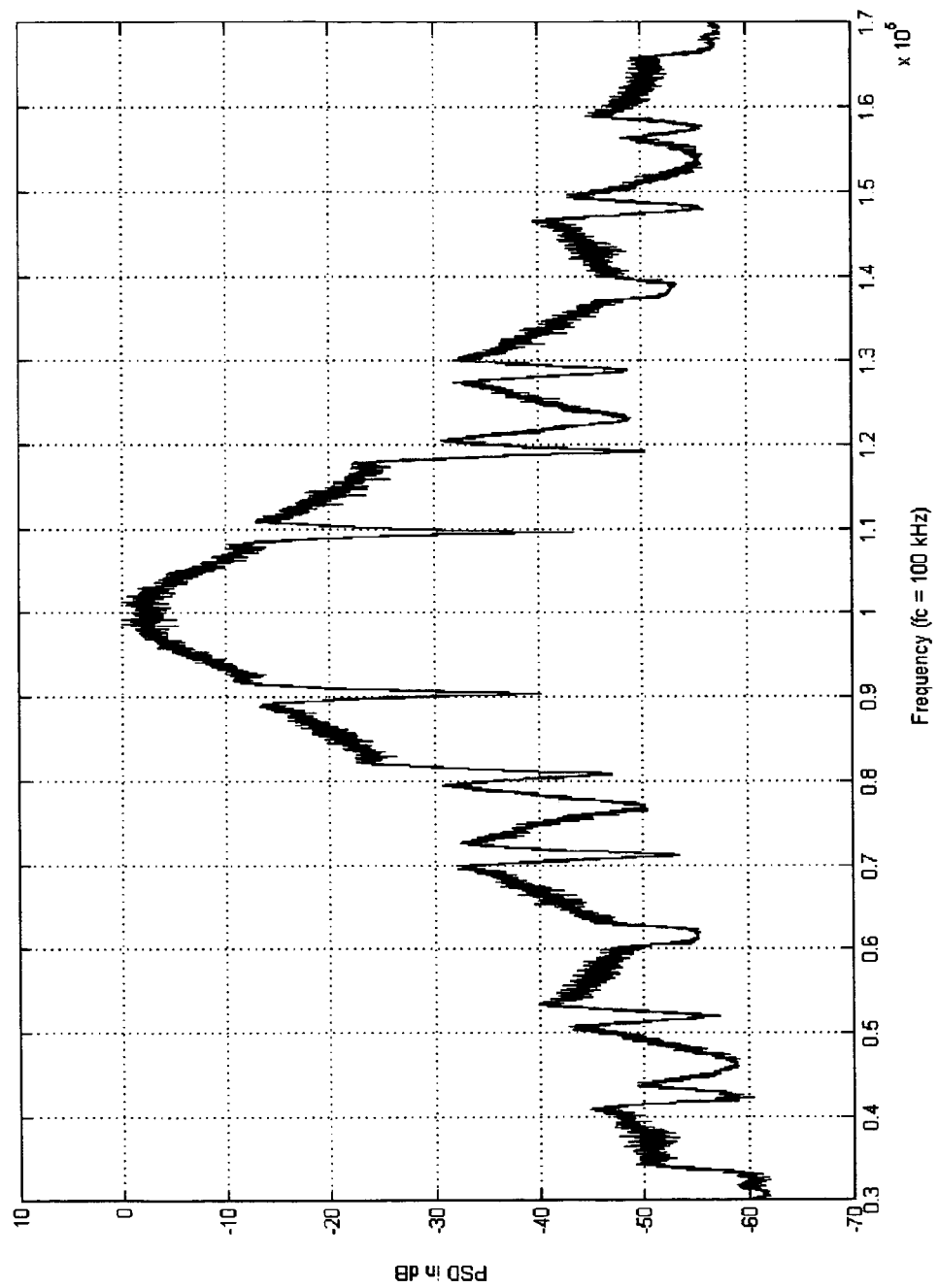
Figure 30:
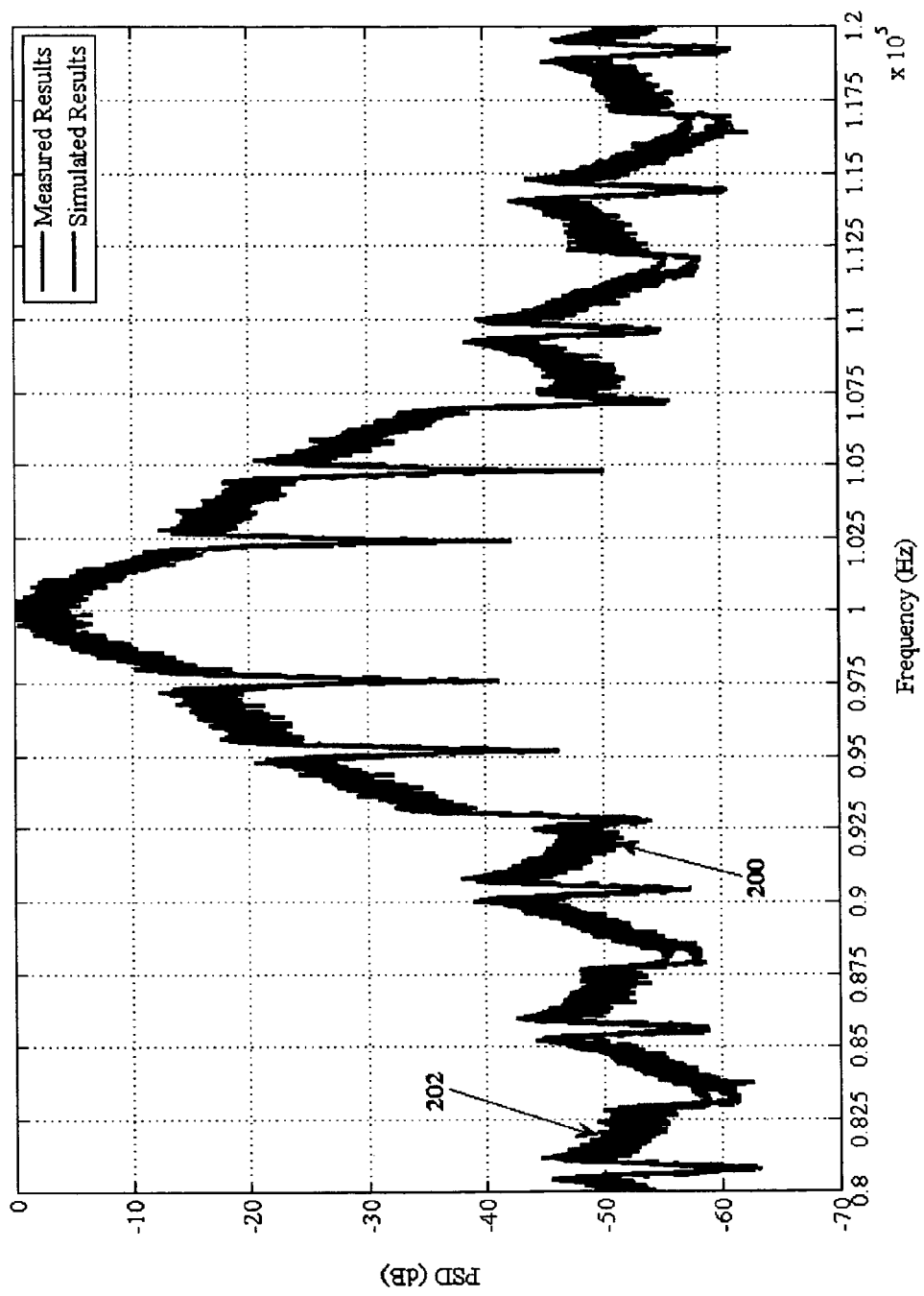
FIGS. 30-35 are diagrams of measured and simulated PSD's of a modulated signal for 50% PWL SBPSK at 2400 bps, for 62.5% PWL SBPSK at 2400 bps, for 50% PWL SBPSK at 4800 bps, for 62.5% PWL SBPSK at 4800 bps, for 50% PWL SBPSK at 9600 bps and for 62.5% PWL SBPSK at 9600 bps, respectively.
Figure 31:
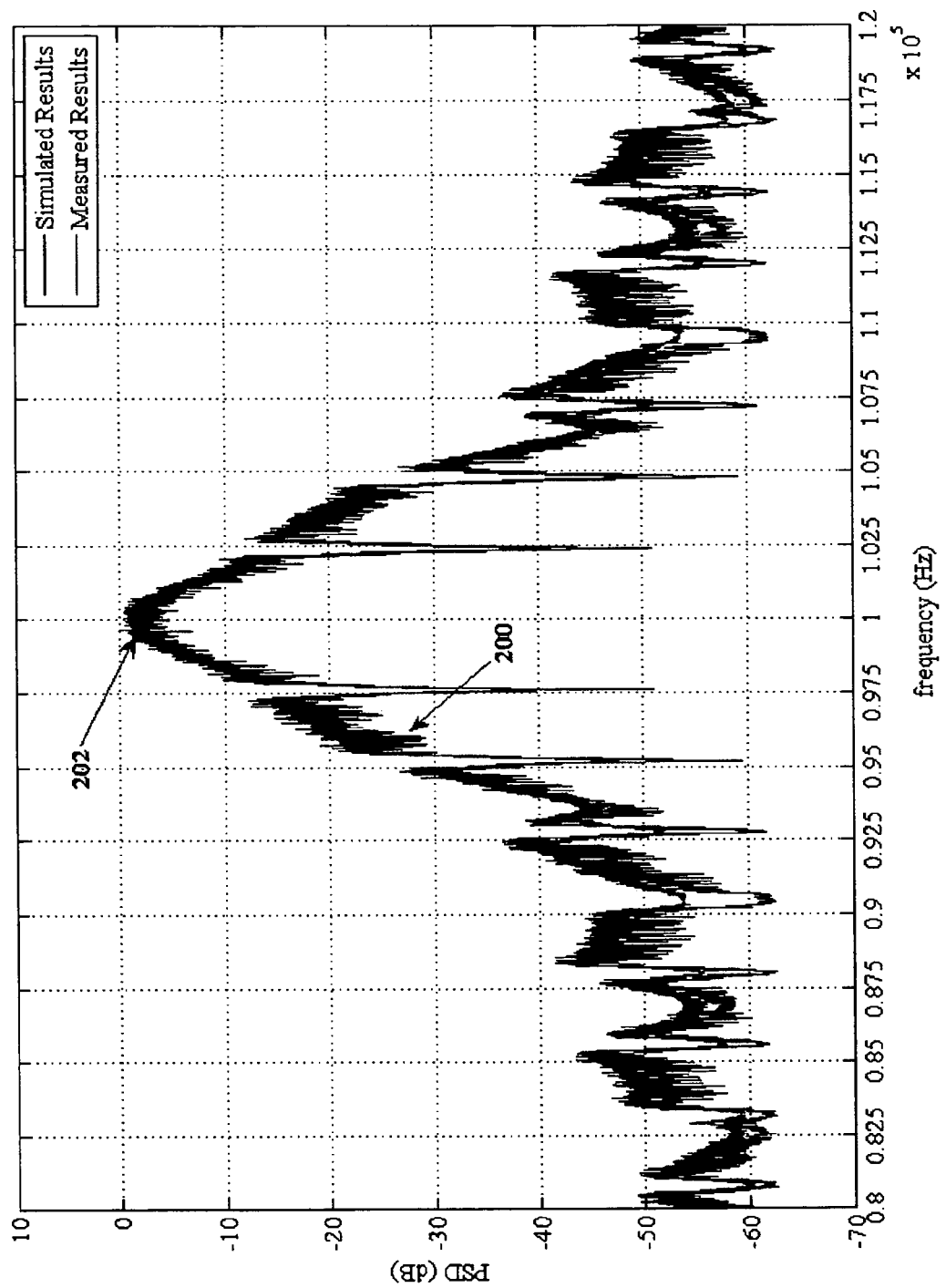
Figure 32:
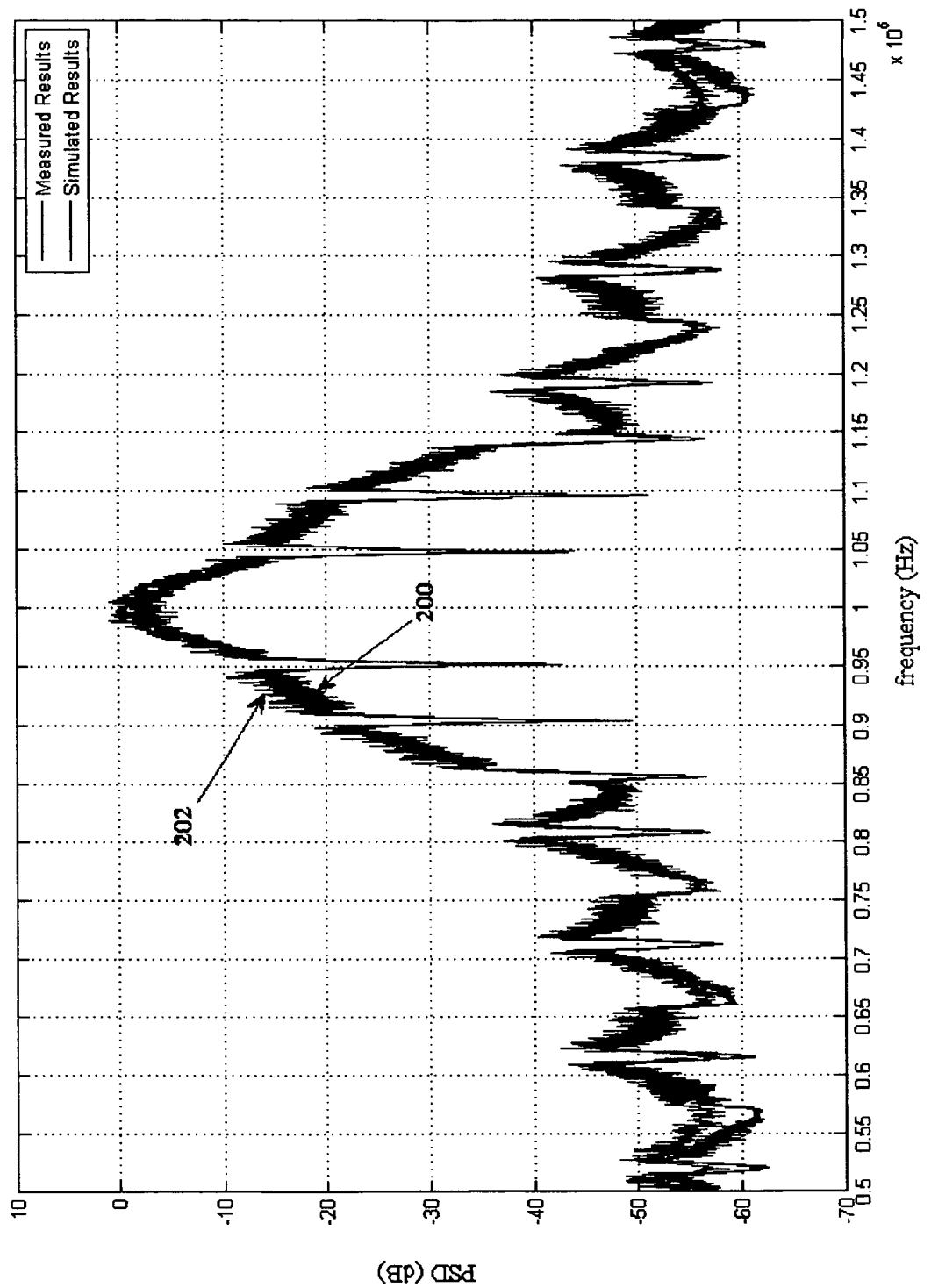
Figure 33:
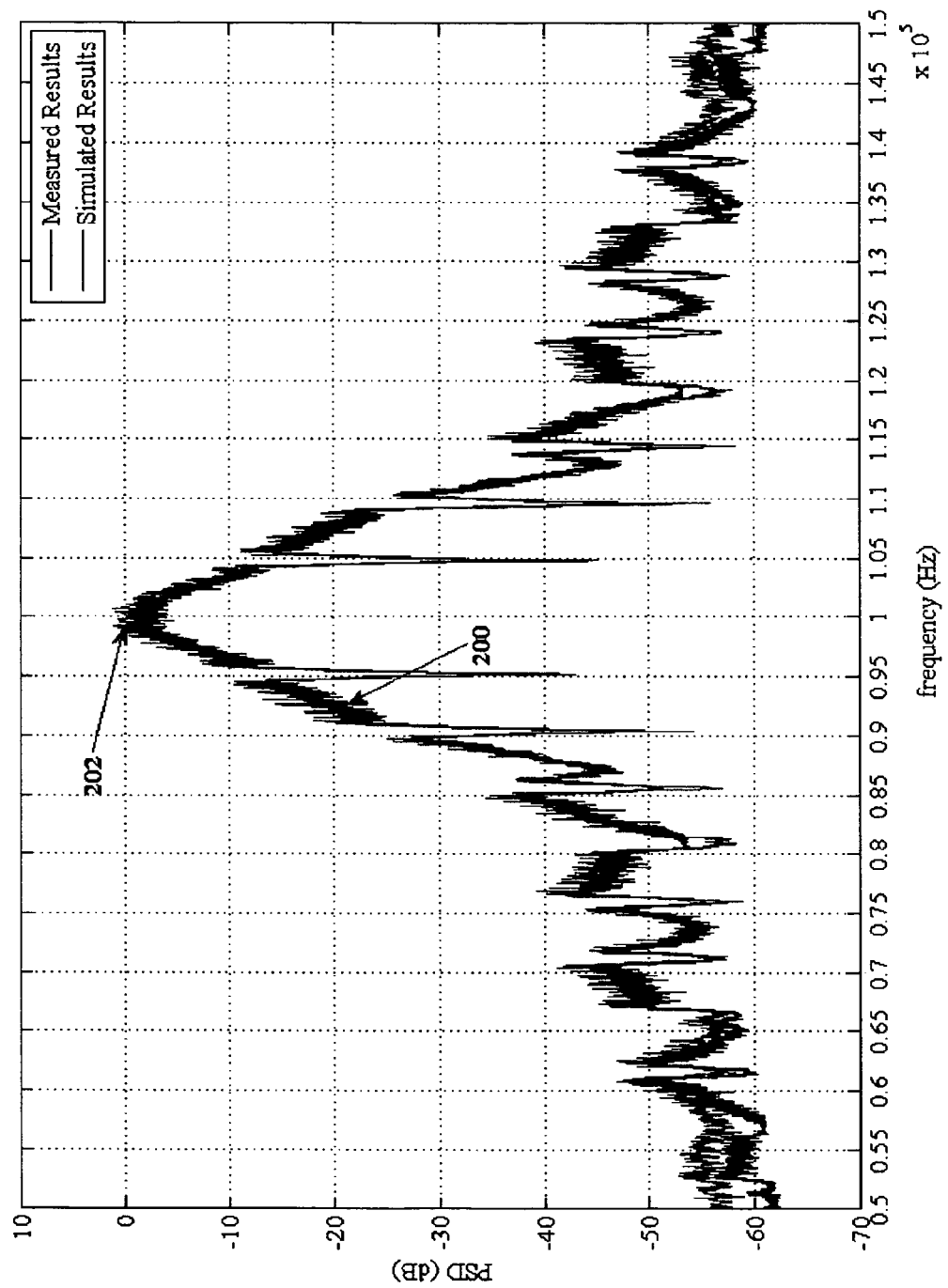
Figure 34:
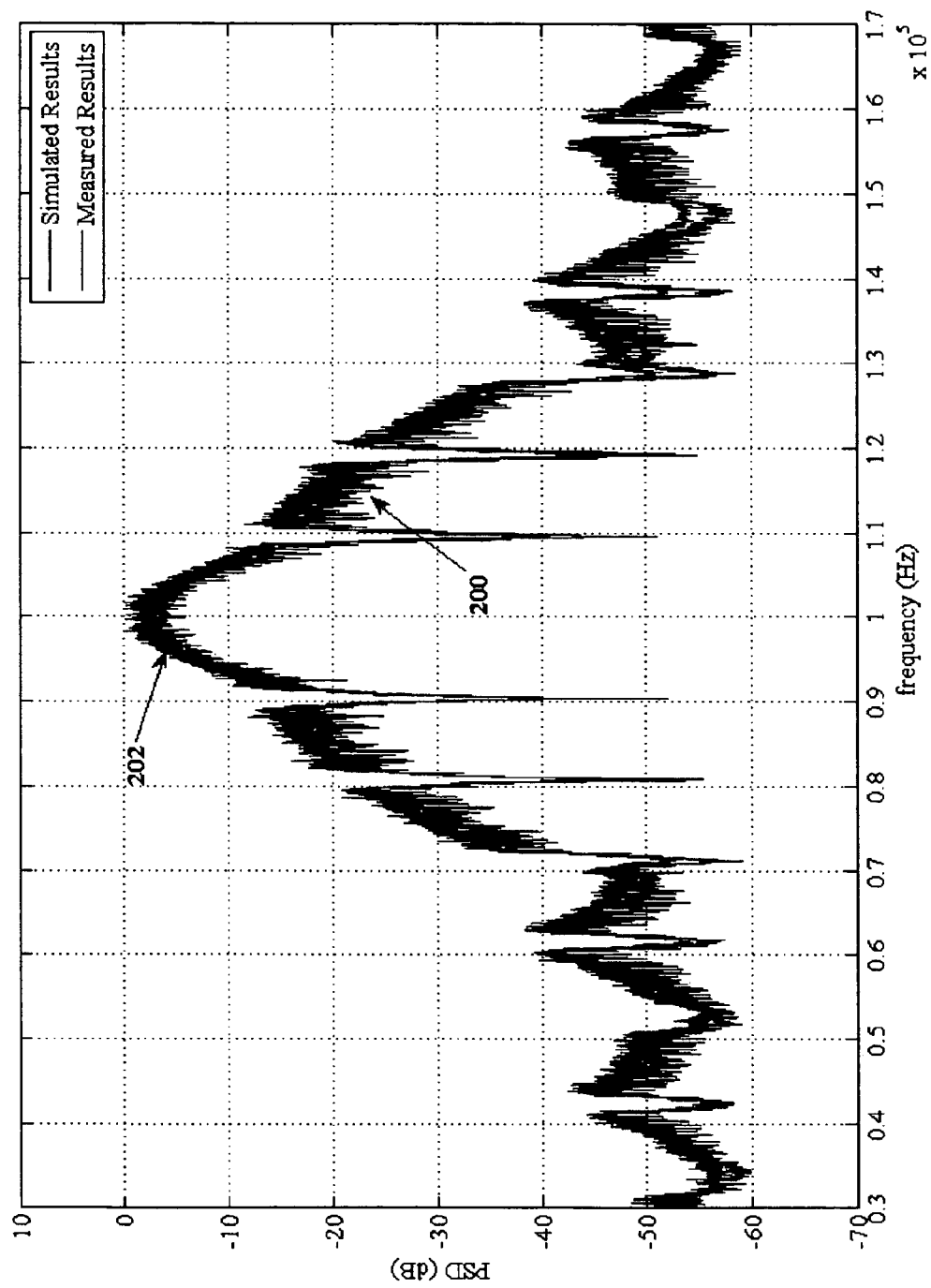
Figure 35:
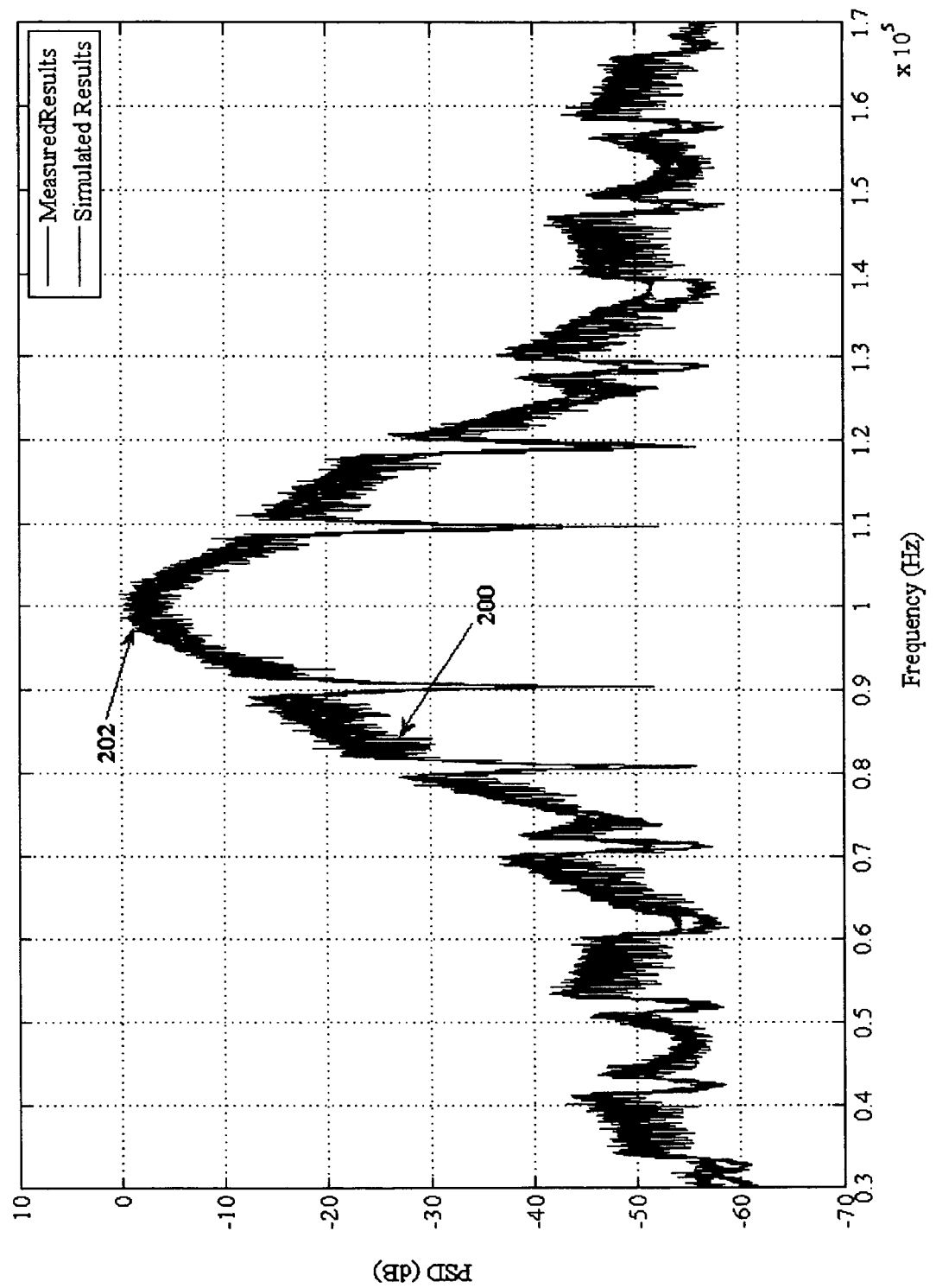

Simulated power spectral densities for PWL SBPSK according to the present inventions are presented in FIGS. 24, 25 and 26 for a 62.5% shaping factor at 2400, 4800 and 9600 bps, respectively. The three slopes of the curve 133 in FIG. 15 were used in these exemplary embodiments to simulate the PSD's.

In the various Figures presented herein, the power emitted into the adjacent channels measured with respect to the carrier transmitted power is computed by:

$$P_{ACE}(n) = \frac{\int_{fc}^{fc+(n-1)B} E[X(f)X^*(f)]df}{\int_{fc}^{\infty} E[X(f)X^*(f)]df}$$

Where E denotes the expected value that performs a video averaging operation on a spectrum analyzer. Video averaging is achieved by determining a fast Fourier transform of the waveform many times to produce an ensemble of fast Fourier transforms and averaging the results over each frequency bin. X(f) denotes the Fourier transform of the transmitted waveform, B is the bandwidth (in the present inventions a 5 kHz narrowband bandwidth or a 25 kHz wideband bandwidth). The adjacent channels for the narrow band case are centered at 5 n kHz, where n=1-6 in certain of the Figures herein. The adjacent channels for the wide band case are centered at 25 n, where n=1-6 for certain of the Figures herein.

One ACE figure of merit expressed in dBc is given by:

$$P_{ACE}(n) = 10 \cdot \text{Log}_{10}\left\{\frac{E\left[\int_{fc}^{fc+(n-1)B} X(f)X^*(f)df\right]}{E\left[\int_{fc}^{\infty} X(f)X^*(f)df\right]}\right\}$$

The values of the ACE figures of merit for adjacent channel power leakage for various shaping factors (including the prior art SBPSK shaping) are summarized in FIG. 27 for 2400 bps operating in the 5 kHz narrowband channel mode, in FIG. 28 for 4800 bps operating in 25 kHz wideband channels and in FIG. 29 for 9600 bps operating in 25 kHz wideband channels.

The ACE characteristics achievable according to the present inventions were predicted by simulation then verified by actual measurements of the resulting power spectra of the PWL SBPSK waveforms at various shape factors and various data rates as presented. FIGS. 30-35 depicts measured (curves 200) and simulated (curves 202) PSDs for 50% PWL SBPSK at 2400 bps, for 62.5% PWL SBPSK at 2400 bps, for 50% PWL SBPSK at 4800 bps, for 62.5% PWL SBPSK at 4800 bps, for 50% PWL SBPSK at 9600 bps and for 62.5% PWL SBPSK at 9600 bps.

MIL-STD 188-181A specifies the ACE requirements for each of the nearest six adjacent channels for both the narrowband (5 kHz) and wideband (25 kHz) channels. FIG. 36 summarizes both measured and simulated ACE results for a 62.5% PWL SBPSK signal of the present invention at a 2400 bps data rate, and further shows the prior art 50% SBPSK ACE characteristics and the MIL-STD 188-181A requirements. It is noted that 62.5% PWL SBPSK according to the present inventions offers noticeable ACE improvement of over 4 dB in the second channel, and 0.2 dB in the first channel when compared with the prior art 50% SBPSK. FIG. 37 reports the same information for 4800 bps and FIG. 38 for 9600 bps.

Figure 39:
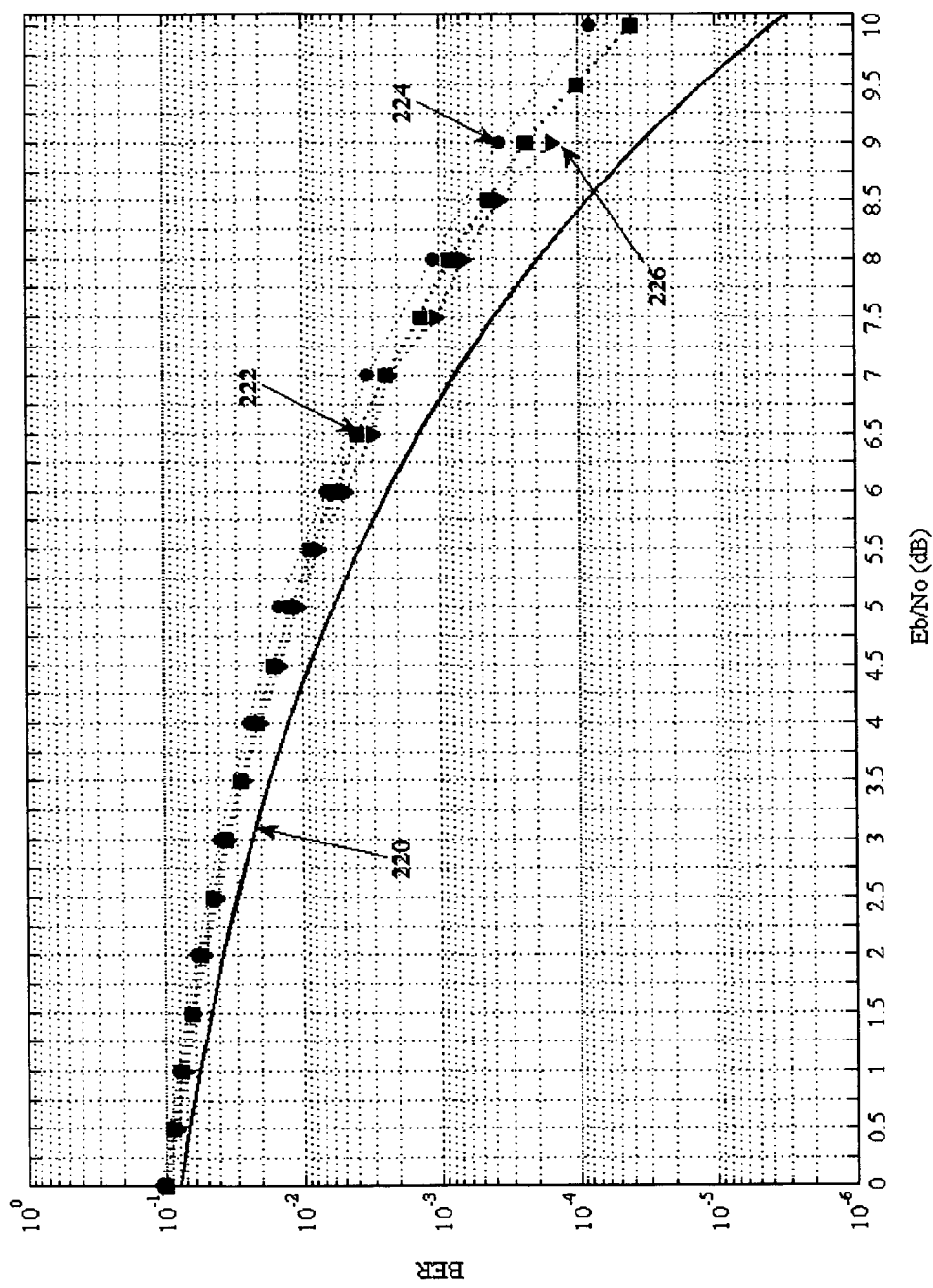
FIGS. 39 and 40 are diagrams illustrating the BER performance of the PWL SBPSK techniques of the present invention.
Figure 40:
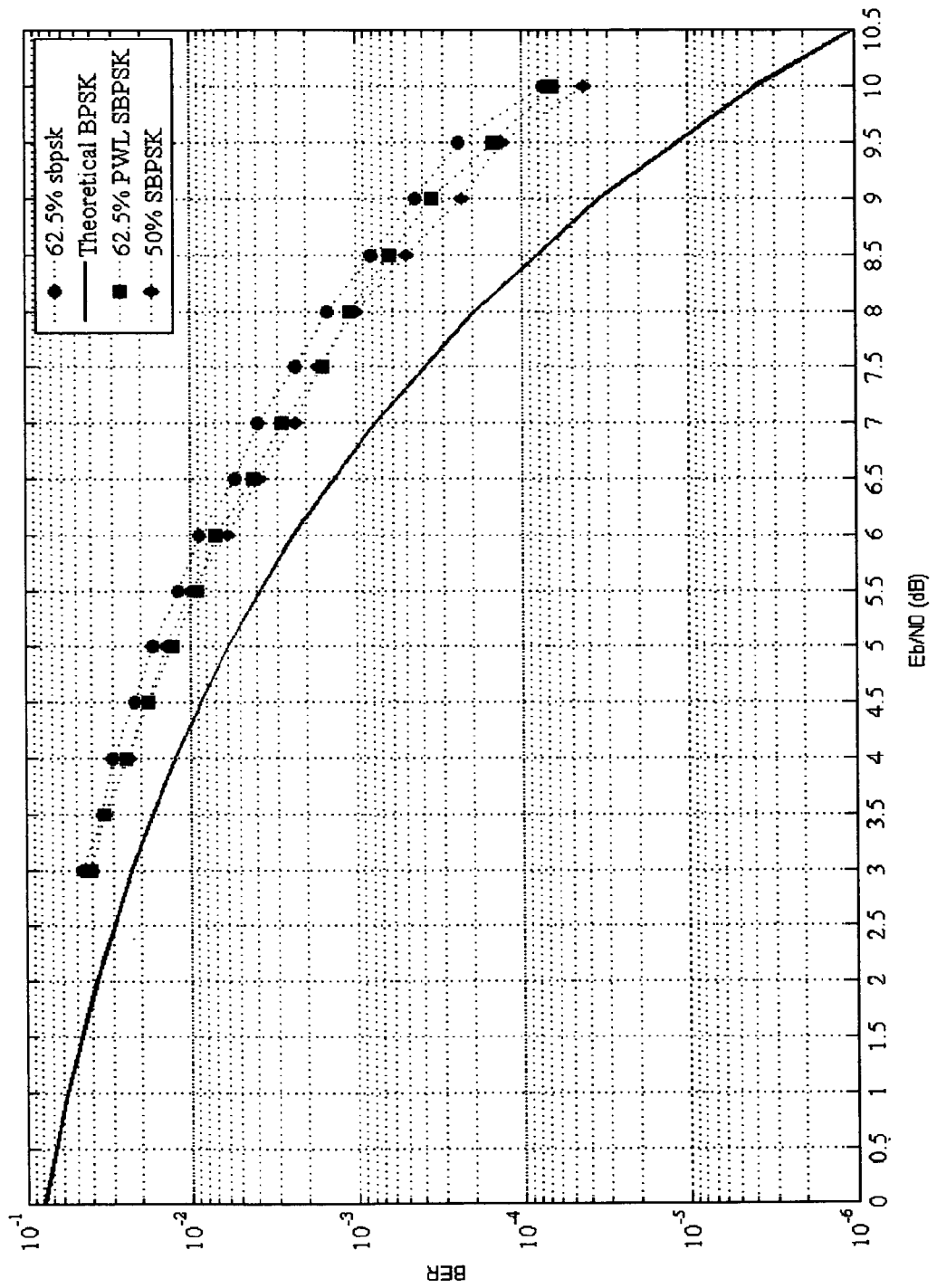

Performance with respect to bit error rate (BER) has been simulated and measured in an additive white Gaussian noise (AWGN) environment for both the prior art SBPSK shaping factor and PWL SBPSK shaping factors of the present invention. The BER simulation results are depicted in FIG. 39. A curve 220 represents the BER for a BPSK signal demodulated by a coherent matched filter demodulator. Curves 222, 224 and 226 depict simulated BER performance for 50% SBPSK, 62.5% SBPSK, and 62.5% PWL SBPSK, respectively. The 50% SBPSK incurs about 1 dB of implementation loss above BPSK, and 62.5% SBPSK incurs about an additional 0.5 dB of implementation loss above 50% SBPSK. The 62.5% PWL SBPSK introduced by the present invention offers better implementation loss than its linear 62.5% SBPSK counterpart. As can be seen, the 62.5% PWL SBPSK performance is almost as good as linear 50% SBPSK in terms of implementation loss and clearly superior to the 62.5% SBPSK case. The measured BER results of FIG. 40 are in good agreement with the simulated results presented in FIG. 39.

Thus the PWL SBPSK technique of the present inventions provides improved performance by reducing the power spectral density in adjacent frequency channels to satisfy the ACE requirements in the UHF SATCOM 5 kHz narrowband and 25 kHz wideband channels. The PWL SBPSK technique is an improvement over the prior art SBPSK technique without unduly affecting the system BER or other performance parameters.

Figure 41:
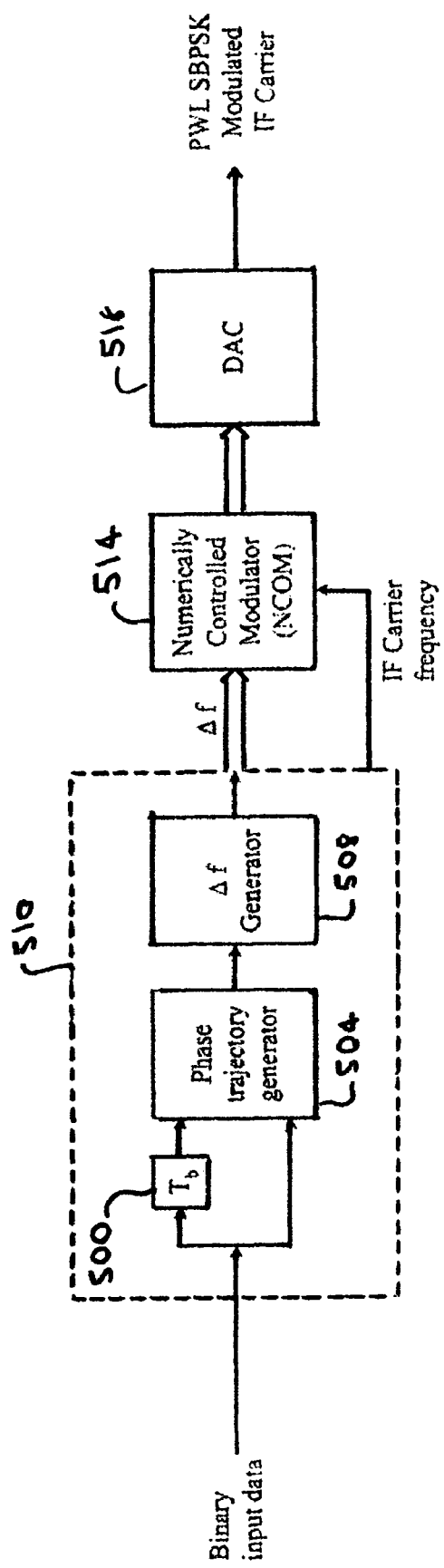
FIG. 41 illustrates an exemplary hardware architecture for implementing the teachings of the present inventions.

FIG. 41 illustrates hardware elements for producing the PWL SBPSK shaping factors for phase transition shaping according to one embodiment of the present inventions. Binary data stream is supplied in parallel as an input to a delay element 500 (for producing a delayed version of the data stream) and to a phase trajectory generator 504. The delayed version of the data stream is also supplied to the phase trajectory generator 504 for generating phase trajectories as described above. The phase trajectories are supplied to a frequency generator 508 for generating a frequency deviation determined by the slope of the phase transition line segment (i.e., the derivative of the phase transition). In one embodiment, the delay element 500, the phase trajectory generator 504 and the frequency generator 508 are components of a digital signal processor 510.

The Δf values are supplied to a NCOM 514, where a carrier signal (in one embodiment an intermediate frequency carrier signal) is modulated to generate a modulated carrier signal. A DAC (digital to analog converter) 518 converts input digital values to an analog form to produce a PWL SBPSK at the carrier signal frequency.

Although the present invention has been described in the context of a UHF SATCOM communications system, the teachings are applicable to any phase modulated signal where it is desired to control the ACE. Use of the 2400, 4800 and 9600 bits per second data rates as used in the above discussion and figures is merely exemplary. The teachings of the present invention are not limited to these data rates.

Also, although implementation of the invention is presented using a interrupt-driven digital numerically controlled modulator DSP, those skilled in the art recognize that there are other implementation methods, such as direct phase trajectory implementations, that can be used.

The phase transitions are not restricted to piecewise linear phase transitions between −180 degrees and +180 degrees as used in the presented exemplary embodiments, but can be defined by any non-linear function (sinusoidal, exponential, etc.). Although the invention has been described using three line slopes (three line segments) during the shaping period, other embodiments include more or fewer (but greater than 2) line slopes.

Preferably, the phase transitions of the present inventions proceed from 0 to 180 degrees during one transition and then from 180 degrees clockwise to 0 degrees (i.e., −180 degrees) during the next transition.

Although the teachings of the various embodiments of invention have been described with reference to a signal comprising binary bits, the teachings are also applicable to M-ary signaling wherein a signal comprises symbols, such as offset QPSK (OQPSK) and shaped offset QPSK (SOQPSK).

While the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A method for controlling phase transitions of a modulated signal during a phase transition interval of a modulating signal, the phase transition interval comprising a fractional portion of a bit period, the phase transition interval further comprising a first portion prior to a transition from a first value to a second value in the modulating signal and a second portion after the transition, the method comprising:

selecting first and second phase trajectories to shape the phase transitions of the modulated signal during the first portion, the first and second phase trajectories operative to successively control the modulated signal during the first portion, the first and second phase trajectories representing different phase shaping parameters;

selecting third and fourth phase trajectories to shape the phase transition of the modulated signal during the second portion, the third and fourth phase trajectories operative to successively control the modulated signal during the second portion, the third and fourth phase trajectories representing different phase shaping parameters; and transitioning the phase of the modulated signal during the first and second portions according to the first, second, third and fourth phase shaping parameters.

2. The method of claim 1 wherein the first, second, third and fourth phase trajectories are each represented by a piecewise linear line segments.

3. The method of claim 2 wherein the piecewise linear line segments of the first, second, third and fourth phase trajectories present at least three different line slopes.

4. The method of claim 1 wherein the first, second, third and fourth phase trajectories are represented by a respective first, a second, a third and a fourth piecewise linear line segment, the first and the fourth line segments having a first slope and the second and third line segments having a second slope different than the first slope.

5. The method of claim 1 wherein the modulating signal comprises a binary signal alternating between a first state and a second state, wherein the first portion of the phase transition interval comprises an interval prior to the transition from the first state to the second state and the second portion of the phase transition interval comprises an interval after transition from the first state to the second state.

6. The method of claim 5 wherein the modulating signal comprises a plurality of binary bits each of the binary bits having a bit period.

7. The method of claim 6 wherein the transitioning step comprises determining a start point for the phase transition interval during the first binary bit duration.

8. The method of claim 1 wherein the different phase shaping parameters represent different phase slopes, wherein the phase slopes relate to a frequency of the modulated signal, and wherein the first and second phase trajectories comprise respective first and second continuous line segments each having a different slope, wherein the frequency of the modulated signal takes on first and second different frequencies during the first portion responsive to the respective first and second phase trajectories.

9. The method of claim 1 wherein the fractional portion comprises 50%, 62.5% or 75%.

10. The method of claim 1 wherein the transitioning step comprises determining a rate of change of the phase trajectories for controlling a frequency of the modulated signal in response thereto.

11. The method of claim 1 wherein the modulated signal comprises an intermediate frequency carrier signal or a radio frequency carrier signal.

12. The method of claim 1 wherein the phase transitions from 0 degrees to ±180 degrees during the phase transition interval or transitions from ±180 degrees to 0 degrees.

13. The method of claim 1 wherein the first, second, third and fourth phase trajectories are represented by linear phase transition line segments with different slopes that are piecewise linear and time continuous during the phase transition interval.

14. The method of claim 13 wherein a slope of the line segments representing the second and third phase trajectories are the same.

15. The method of claim 1 wherein the steps of selecting the first, second, third and fourth phase trajectories comprises selecting phase trajectories to control adjacent channel interference in the modulated signal.

16. A method for controlling a frequency of a modulated signal during a phase transition interval of a modulating signal, the phase transition interval comprising a fractional portion of a bit period, wherein the phase transition interval comprises a first portion prior to a transition from a first value to a second value in the modulating signal and a second portion after the transition from the first to the second value in the modulating signal, the method comprising:

during the first portion of the phase transition interval of the modulating signal, controlling the frequency of the modulated signal according to a phase trajectory represented by two or more successive piecewise linear line segments, each line segment representing a different frequency for the modulated signal; and during the second portion of the phase transition interval of the modulating signal, controlling the frequency of the modulated signal according to a phase trajectory represented by two or more successive piecewise linear line segments, each line segment representing a different frequency for the modulated signal.

17. The method of claim 16 wherein the step of controlling the frequency comprises controlling the frequency according to a derivative of the phase trajectory with time.

18. The method of claim 16 wherein a slope of the line segment of the phase trajectory represents a frequency.

19. An apparatus for producing a modulated carrier signal responsive to a modulating signal, the modulating signal having a phase transition interval comprising a fractional portion of a bit period of the modulating signal, the phase transition interval comprising a first portion prior to a transition from a first value to a second value in the modulating signal and a second portion after the transition, the apparatus comprising:

a phase trajectory generator responsive to the modulating signal for producing a first signal represented by two or more successive curve segments each curve segment presenting a different phase shaping parameter for use during the first portion;

the phase trajectory generator responsive to the modulating signal for producing a second signal represented by two or more successive curve segments each curve segment presenting a different phase shaping parameter for use during the second portion; and a modulator responsive to the first and second signals and to an oscillating signal, the modulator for operating on the oscillating signal to produce the modulated signal, the modulated signal having a characteristic responsive to the different phase shaping parameters during the first portion of the modulating signal and a characteristic responsive to the different phase shaping parameters during the second portion of the modulating signal.

20. The apparatus of claim 19 wherein the characteristic comprises phase transitions or frequency.

21. The apparatus of claim 20 wherein the frequency is determined responsive to a rate of change of the phase shaping parameter.

22. The apparatus of claim 19 wherein the two or more curve segments for use during the first portion and the two or more curve segments for use during the second portion each comprise two or more piecewise linear line segments.

23. The apparatus of claim 22 wherein the phase shaping parameter associated with the two or more curve segments for use during the first portion comprises two or more line slopes, and wherein the two or more line slopes are different line slopes.

24. The apparatus of claim 22 wherein the two or more curve segments for use during the first portion and the two or more curve segments for use during the second portion comprise a first, a second, a third and a fourth line segment, the first and the fourth line segments having a first slope and the second and third line segments having a second slope different than the first slope.

25. The apparatus of claim 22 wherein the modulating signal comprises a binary signal alternating between a first state and a second state.

* * * * *